(12) United States Patent
Nebashi et al.

(10) Patent No.: US 10,979,053 B2
(45) Date of Patent: Apr. 13, 2021

(54) LOGIC INTEGRATED CIRCUIT

(71) Applicant: NanoBridge Semiconductor, Inc., Tokyo (JP)

(72) Inventors: Ryusuke Nebashi, Tokyo (JP); Toshitsugu Sakamoto, Tokyo (JP); Makoto Miyamura, Tokyo (JP); Yukihide Tsuji, Tokyo (JP); Ayuka Tada, Tokyo (JP); Xu Bai, Tokyo (JP)

(73) Assignee: NANOBRIDGE SEMICONDUCTOR, INC., Ibaraki (JP)

( * ) Notice: Subject to any disclaimer, the term of this patent is extended or adjusted under 35 U.S.C. 154(b) by 0 days.

(21) Appl. No.: 16/957,973

(22) PCT Filed: Jan. 21, 2019

(86) PCT No.: PCT/JP2019/001581
§ 371 (c)(1),
(2) Date: Jun. 25, 2020

(87) PCT Pub. No.: WO2019/146534
PCT Pub. Date: Aug. 1, 2019

(65) Prior Publication Data
US 2020/0336145 A1 Oct. 22, 2020

(30) Foreign Application Priority Data
Jan. 25, 2018 (JP) .............................. JP2018-010114

(51) Int. Cl.
*H03K 19/177* (2020.01)
*H01L 25/00* (2006.01)
(Continued)

(52) U.S. Cl.
CPC ..... *H03K 19/17744* (2013.01); *G11C 13/004* (2013.01); *G11C 13/0026* (2013.01);
(Continued)

(58) Field of Classification Search
None
See application file for complete search history.

(56) References Cited

U.S. PATENT DOCUMENTS

| | | | |
|---|---|---|---|
| 10,573,375 B1* | 2/2020 | He | G11C 11/413 |
| 2015/0357032 A1* | 12/2015 | Tatsumura | G11C 11/1673 365/72 |
| 2019/0028101 A1* | 1/2019 | Nebashi | H01L 45/085 |

FOREIGN PATENT DOCUMENTS

| | | |
|---|---|---|
| JP | 4356542 B2 | 11/2009 |
| JP | 2011-258829 A | 12/2011 |

(Continued)

OTHER PUBLICATIONS

Miyamura et al., "Low-power Programmable-logic Cell Arrays using Nonvolatile Complementary Atom Switch", 15th Int'l Symposium on Quality Electronic Design (ISQED), 2014, pp. 330-334 (total 5 pages).

(Continued)

*Primary Examiner* — Anh Q Tran
(74) *Attorney, Agent, or Firm* — Dority & Manning, P.A.

(57) ABSTRACT

A logic integrated circuit includes a switch cell array. The switch cell array includes: a plurality of first wirings extending in a first direction; a plurality of second wirings extending in a second direction; a switch cell including a unit element including two serially connected resistance-changing elements, and a cell transistor to be connected to a shared terminal of the two resistance-changing elements; and a bit line to which the shared terminal is connected via the cell transistor. Two of the switch cells adjacent to each other in the first direction are each connected to the different first wiring and second wiring, and share the bit line, and a diffusion layer to which the bit line is connected.

10 Claims, 22 Drawing Sheets

(51) Int. Cl.
*H03K 19/17736* (2020.01)
*G11C 13/00* (2006.01)
*H03K 19/17704* (2020.01)
*H03K 19/1776* (2020.01)

(52) U.S. Cl.
CPC ..... *G11C 13/0069* (2013.01); *H03K 19/1776* (2013.01); *H03K 19/17708* (2013.01)

(56) References Cited

FOREIGN PATENT DOCUMENTS

| | | |
|---|---|---|
| JP | 2018-7167 A | 1/2018 |
| WO | 2012/043502 A1 | 4/2012 |
| WO | 2016/042750 A1 | 3/2016 |
| WO | 2016/194332 A1 | 12/2016 |
| WO | 2017/126451 A1 | 7/2017 |

OTHER PUBLICATIONS

Internal Search Report for PCT/JP2019/001581 dated Apr. 16, 2019.
Written Opinion of the International Searching Authority for PCT/JP2019/001581 dated Apr. 16, 2019.

\* cited by examiner

LOGIC INTEGRATED CIRCUIT

This application is a National Stage Entry of PCT/JP2019/001581 filed on Jan. 21, 2019, which claims priority from Japanese Patent Application 2018-010114 filed on Jan. 25, 2018, the contents of all of which are incorporated herein by reference, in their entirety.

TECHNICAL FIELD

The present invention relates to a reconfigurable logic integrated circuit using a resistance-changing switch.

BACKGROUND ART

A programmable logic integrated circuit such as a field programmable gate array (FPGA) is constituted of a logic element, an input/output element, and a connection element. The logic element provides a programmable logic operation function. For example, as the logic element, a logic block constituted of a lookup table for achieving a combinational circuit, a flip-flop for holding data, and a selector is used. The input/output element provides a programmable input/output function from and to an outside of a device. The connection element provides a programmable connection function between the logic element and the input/output element. A user is allowed to form a desired logic circuit in a programmable logic integrated circuit by optionally combining a plurality of logic blocks. Information (also referred to as configuration information) necessary for forming a desired logic circuit is stored in a memory element included in the programmable logic integrated circuit. For example, a static random access memory (SRAM) cell is used as the memory element for storing the configuration information.

Generally, a switch for changeably connecting memory elements or logic blocks is formed on a same layer as the logic block constituted of a plurality of transistors. When a switch and a logic block are formed on a same layer, an area overhead may increase. When the area overhead increases, a chip area of a programmable logic integrated circuit increases, and thus a production cost rises. When a layout area of a memory element and a switch increases, a ratio of a logic block with respect to a chip area decreases.

PTLs 1 and 2 and NPL 1 disclose a programmable logic integrated circuit using a resistance-changing element being able to be formed on a wiring layer as a switch capable of changing connection between logic blocks after fabrication, while suppressing an increase in layout area. The programmable logic integrated circuit of PTLs 1 and 2 and NPL 1 has a configuration in which a resistance-changing element including a solid electrolytic material containing metal ions is disposed between a first wiring layer and a second wiring layer. The resistance-changing element is able to change a resistance value by applying, to both terminals thereof, a bias voltage in a forward direction or a reverse direction. The resistance-changing element has a resistance ratio between a low resistance state (ON-state) and a high resistance state (OFF-state) being equal to or greater than the fifth power of 10. Specifically, the resistance-changing element functions as a switch for electrically connecting or disconnecting a first wiring and a second wiring.

For connection and disconnection of a wiring in a general programmable logic integrated circuit, an SRAM cell being a memory element, and a switch cell including one transistor having a switch function are used. Meanwhile, a resistance-changing element has both of a memory function and a switch function. Therefore, it is possible to achieve a switch cell by one resistance-changing element.

In a semiconductor device of PTL 1, a resistance-changing element is disposed at each of intersections between a first wiring group and a second wiring group. Therefore, in the semiconductor device of PTL 1, it is possible to achieve a crossbar switch capable of connecting or disconnecting any wiring of the first wiring group and any wiring of the second wiring group, with a compact size. Consequently, a chip area is remarkably reduced, and usage efficiency of a logic block is improved. Therefore, performance enhancement of a programmable logic integrated circuit can be expected. An ON-state or an OFF-state of the resistance-changing element is held, even when power supply to the programmable logic integrated circuit is stopped. Therefore, the semiconductor device of PTL 1 also has an advantage that it is possible to eliminate an operation of loading configuration information, each time power is turned on.

FIG. 22 is a conceptual diagram illustrating one example of a crossbar circuit using a switch cell including a resistance-changing element. A crossbar circuit 110 in FIG. 22 has a configuration in which switch cells 113 are disposed at positions where a plurality of first wirings 111 and a plurality of second wirings 112 intersect with each other. In FIG. 22, the switch cells 113 in an ON-state are illustrated as solid black squares, and the switch cells 113 in an OFF-state are illustrated as hollow squares. The crossbar circuit 110 in FIG. 22 represents a state that the crossbar circuit 110 is connected as a crossbar by setting the switch cells 113 on a diagonal line to an ON-state.

FIG. 23 is a conceptual diagram illustrating one example of a crossbar circuit for the purpose of reducing a circuit area. A crossbar circuit 120 in FIG. 23 has a configuration in which switch cells 123 are disposed at some of positions where a plurality of first wirings 121 and a plurality of second wirings 122 intersect with each other. In FIG. 23, the switch cells 123 in an ON-state are illustrated as solid black squares, and the switch cells 123 in an OFF-state are illustrated as hollow squares. The crossbar circuit 120 in FIG. 23 represents a state that the crossbar circuit 120 is connected as a crossbar by setting the switch cells 123 on a diagonal line to an ON-state.

CITATION LIST

Patent Literature

[PTL 1] Japanese Patent No. 4356542
[PTL 2] International Publication No. WO2012/043502
[PTL 3] International Publication No. WO2016/042750
[PTL 4] Japanese Unexamined Patent Application Publication No. 2011-258829

Non Patent Literature

[NPL 1] M. Miyamura et al., "Low-power programmable-logic cell arrays using nonvolatile complementary atom switch", 15th International symposium on Quality Electronic Design (ISQED), pp. 330 to 334, 2014

SUMMARY OF INVENTION

Technical Problem

As compared with the crossbar circuit 110 in FIG. 22, the crossbar circuit 120 in FIG. 23 has a smaller number of switch cells 123 to be mounted. Therefore, the crossbar circuit 120 in FIG. 23 is able to reduce an area of the crossbar circuit 120 with respect to the entirety of the circuit, although a degree of freedom of a connection pattern is reduced. However, the crossbar circuit in FIG. 23 has an issue that it is difficult to achieve a reduction rate of a layout area to a same degree as a reduction rate of the number of switch cells, due to constraints on a layout of wirings and/or transistors.

An object of the present invention is to solve the above-described issue, and provide a logic integrated circuit having a reduced chip area.

Solution to Problem

A logic integrated circuit according to one aspect of the present invention includes a switch cell array. The switch cell array includes: a plurality of first wirings extending in a first direction; a plurality of second wirings extending in a second direction; a switch cell including a unit element including two serially connected resistance-changing elements, and a cell transistor to be connected to a shared terminal of the two resistance-changing elements; and a bit line to which the shared terminal is connected via the cell transistor. Two of the switch cells adjacent to each other in the first direction are each connected to the different first wiring and second wiring, and share the bit line, and a diffusion layer to which the bit line is connected.

Advantageous Effects of Invention

The present invention is able to provide a logic integrated circuit having a reduced chip area.

EXAMPLE EMBODIMENT

Figure 1:
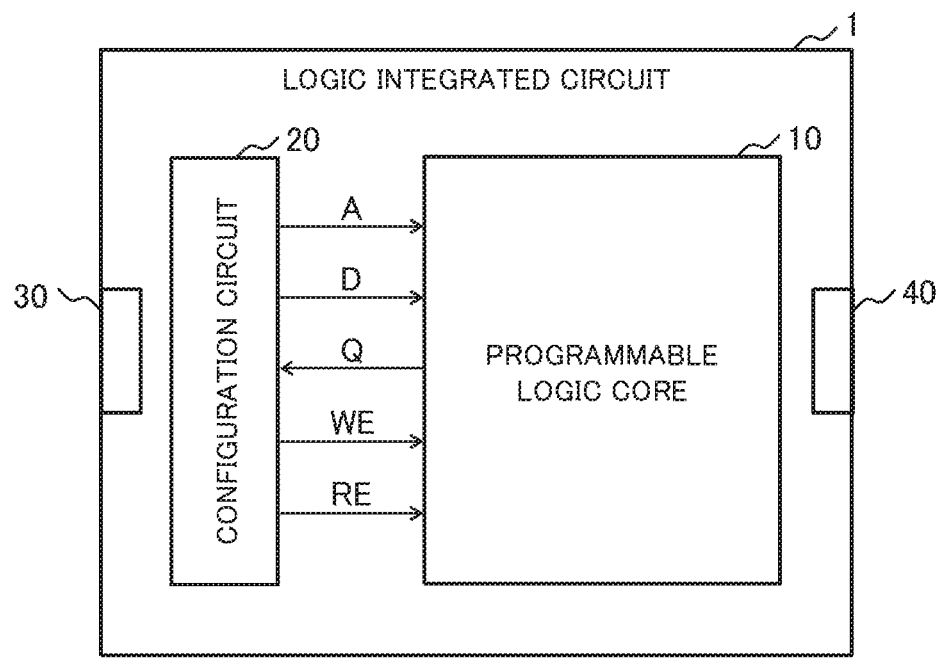
FIG. 1 is a schematic diagram illustrating one example of a configuration of a logic integrated circuit according to a first example embodiment of the present invention.

In the following, example embodiments for implementing the present invention are described with reference to the drawings. The example embodiments described in the following include technically preferred limitations for implementing the present invention. However, the scope of the invention is not limited to the following. In all drawings used in description of the following example embodiments, unless a reason is specifically mentioned, similar elements are indicated with same reference signs. In the following example embodiments, repeated description on a similar configuration/operation may be omitted. Direction of an arrow in the drawings represents one example, and does not limit direction of a signal.

First Example Embodiment (Configuration)

First, a configuration of a logic integrated circuit according to a first example embodiment of the present invention is described with reference to a drawing. FIG. 1 is a schematic diagram illustrating one example of a configuration of a logic integrated circuit 1 according to the present example embodiment. As illustrated in FIG. 1, the logic integrated circuit 1 includes a programmable logic core 10, a configuration circuit 20, a configuration port 30, and a general-purpose port 40.

The programmable logic core 10 includes a switch cell array including a plurality of first wirings extending in a first direction, a plurality of second wirings extending in a second direction, and a plurality of resistance-changing switches (also referred to as switch cells). The resistance-changing switch is disposed at a position where the first wiring and the second wiring intersects with each other. The first wiring and the second wiring are connected to each other via the resistance-changing switch disposed at a position where these wirings intersect with each other.

For example, the resistance-changing switch includes a unit element including two serially connected resistance-changing elements, and a cell transistor to be connected to a shared node of the two resistance-changing elements. The programmable logic core 10 further includes a bit line to which the shared node is connected via the cell transistor. One end of the unit element is connected to one of the first wirings, the other end thereof is connected to one of the second wirings, and the shared node is connected to one of the bit lines via the cell transistor.

For example, two resistance-changing switches adjacent to each other in the first direction are each connected to different first wiring and second wiring. The two resistance-changing switches adjacent to each other in the first direction share a bit line, and a diffusion layer to which the bit line is connected.

The programmable logic core 10 enables a logic to be configured and reconfigured by setting, based on configuration information of a logic circuit, a resistance-changing switch disposed at a position where a first wiring and a second wiring intersect with each other to an ON-state or an OFF-state, and connecting or disconnecting the wirings. The programmable logic core 10 inputs, to a logic circuit configured based on configuration information, input data from the general-purpose port 40, and outputs, to the general-purpose port 40, a logical operation result.

The configuration circuit 20 receives a signal including configuration information input from the configuration port 30, outputs a control signal to the programmable logic core 10, and inputs and outputs data of a switch cell array. By setting a write enable signal WE to a high level at a time of writing of a resistance-changing switch, the configuration circuit 20 writes data input D in a resistance-changing switch of an address A. By setting a read enable signal RE to a high level at a time of reading of a resistance-changing switch, the configuration circuit 20 receives data output Q read out from the resistance-changing switch of the address A.

A signal including configuration information is input to the configuration port 30. The signal including configuration information input from the configuration port 30 is output to the configuration circuit 20. However, a signal to be input and output to and from the configuration port 30 is not limited to the signal including configuration information.

Data are input to the general-purpose port 40. The Data input from the general-purpose port 40 are output to the programmable logic core 10. However, there is no limitation on data to be input and output to and from the general-purpose port 40.

For example, a signal including configuration information for forming a desired logic circuit is input to the configuration port 30. In the configuration circuit 20, a signal is output to a switch cell array included in the programmable logic core 10, based on the signal including configuration information input from the configuration port 30, and data writing and data reading of the switch cell array are performed. Data to be written in the switch cell array are input to the general-purpose port 40. Data read out from the switch cell array are output from the general-purpose port 40.

[Programmable Logic Core]

Figure 2:
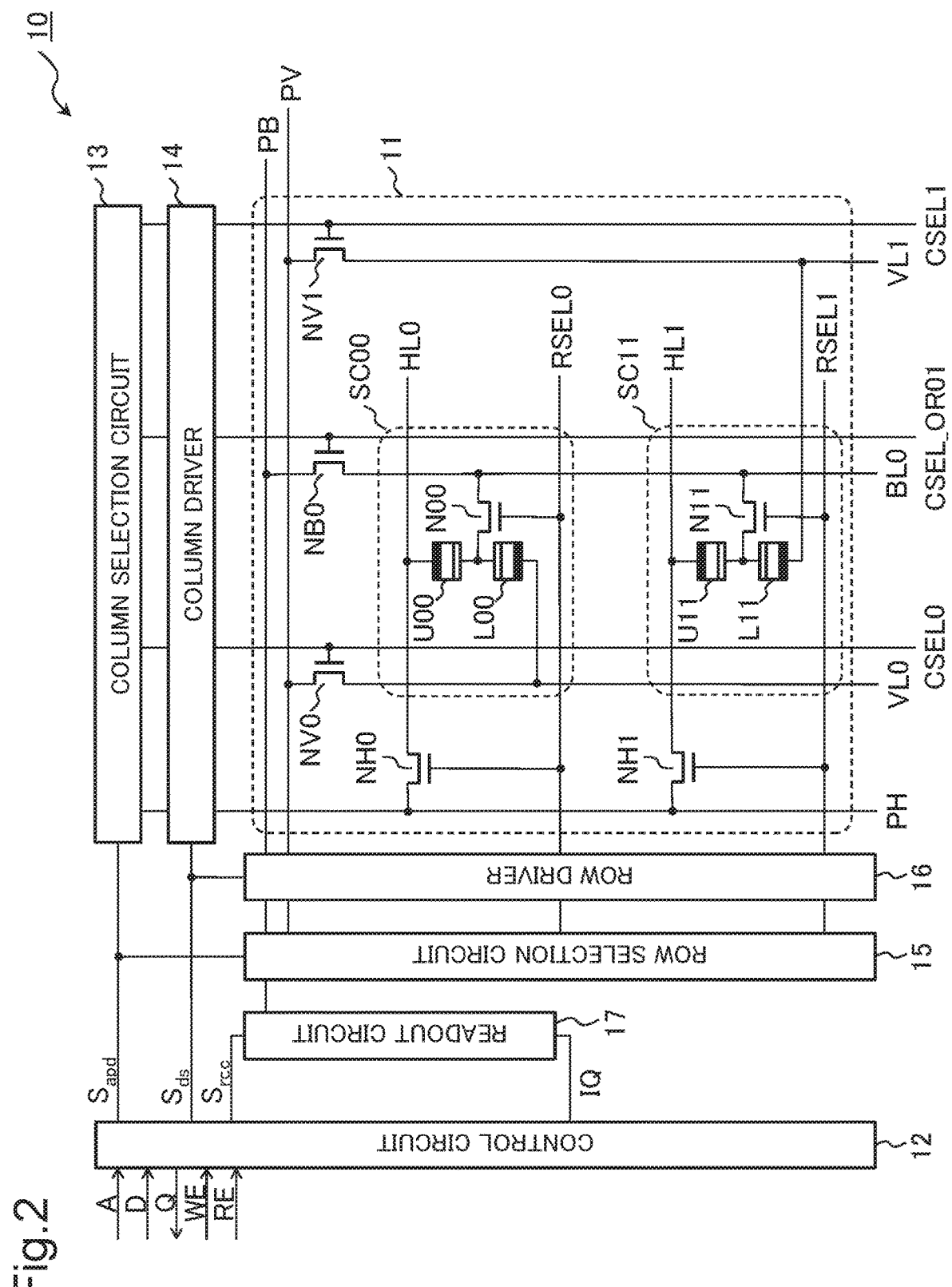
FIG. 2 is a schematic diagram illustrating a circuit configuration of a programmable logic core included in the logic integrated circuit according to the first example embodiment of the present invention.

Next, a circuit configuration of the programmable logic core 10 is described with reference to a drawing. FIG. 2 is a schematic diagram illustrating a circuit configuration of the programmable logic core 10. As illustrated in FIG. 2, the programmable logic core 10 includes a switch cell array 11, a control circuit 12, a column selection circuit 13, a column driver 14, a row selection circuit 15, a row driver 16, and a readout circuit 17. The programmable logic core 10 includes various types of logic circuits, such as a lookup table and a flip-flop, for performing a desired logical operation in combination with the switch cell array 11. However, in the present example embodiment, since a logic circuit is an optional element, illustration of the logic circuit is omitted in FIG. 2.

The switch cell array 11 includes N wirings (also referred to as first wirings) (where N is an integer of 2 or larger) extending in a column direction (also referred to as a first direction), and M wirings (also referred to as second wirings) (where M is an integer of 2 or larger) extending in a row direction (also referred to as a second direction). In the example of FIG. 2, the switch cell array 11 includes two first wirings (VL0 and VL1) extending in the column direction, and two second wirings (HL0 and HL1) extending in the row direction. FIG. 2 illustrates a configuration example in which the switch cell array 11 includes two first wirings and two second wirings. However, there is no limitation on the numbers of the first wirings and the second wirings.

The switch cell array 11 includes switch cells (SC00 and SC11) for switching connection and disconnection of the first wirings (VL0 and VL1) and the second wirings (HL0 and HL1), at portions where the first wirings (VL0 and VL1) and the second wirings (HL0 and HL1) intersect with each other. In other words, the switch cell array 11 includes the switch cells (SC00 and SC11) for switching a connection state of the first wirings (VL0 and VL1) and the second wirings (HL0 and HL1), at intersection positions of the first wirings (VL0 and VL1) and the second wirings (HL0 and HL1). The switch cell array 11 can be constituted of N×M switch cells at maximum. In the example of FIG. 2, the switch cell array 11 includes the two switch cells (SC00 and SC11) at portions where the first wirings and the second wirings intersect with each other.

The switch cell array 11 includes column selection lines (CSEL0, CSEL1, and CSEL_OR01) and a bit line BL0 extending in the column direction, and row selection lines (RSEL0 and RSEL1) extending in the row direction. The column selection lines (CSEL0, CSEL1, and CSEL_OR01) are also referred to as first selection lines, and the row selection lines (RSEL0 and RSEL1) are also referred to as second selection lines.

The switch cell array 11 includes transistors (NV0, NV1, and NB0) disposed in the row direction, and transistors (NH0 and NH1) disposed in the column direction. The transistors (NV0 and NV1) are connected to the first wirings (VL0 and VL1). The transistors (NH0 and NH1) are connected to the second wirings (HL0 and HL1). The transistor NB0 is connected to the bit line BL0. The transistors (NV0 and NV1) are also referred to as first transistors, the transistors (NH0 and NH1) are also referred to as second transistors, and the transistor NB0 is also referred to as a third transistor. For example, the transistors (NV0 and NV1), the transistors (NH0 and NH1), and the transistor NB0 can be constituted of a negative-channel metal oxide semiconductor (NMOS) type transistor.

The switch cell array 11 includes a control line PH extending in the column direction, and control lines (PV and PB) extending in the row direction. The control line PH is connected to the second wirings (HL0 and HL1) via the transistors (NH0 and NH1). The control line PV is connected to the first wirings (VL0 and VL1) via the transistors (NV0 and NV1). The control line PB is connected to the bit line BL0 via the transistor NB0. The control line PH is also referred to as a first control line, the control line PV is also referred to as a second control line, and the control line PB is also referred to as a third control line.

In the switch cell array 11, gates of the transistors (NV0 and NV1) and the transistor NB0 are connected to the different column selection lines (CSEL0, CSEL1, and CSEL_OR01). In the switch cell array 11, gates of the transistors (NH0 and NH1) are connected to the row selection lines (RSEL0 and RSEL1).

The switch cell SC00 includes a first resistance-changing element U00, a second resistance-changing element L00, and a cell transistor N00. The switch cell SC11 includes a first resistance-changing element U11, a second resistance-changing element L11, and a cell transistor N11. Gates of the cell transistors (N00 and N11) of the two switch cells (SC00 and SC11) adjacent to each other in the column direction (first direction) are connected to the different row selection lines (RSEL0 and RSEL1).

Next, a connection relation of a circuit and a driver constituting the programmable logic core 10 is described.

The control circuit 12 receives, as an input signal, address A, data input D, a write enable signal WE, and a read enable signal RE, and outputs data output Q. The control circuit 12 outputs an address pre-decode signal $S_{apd}$ to the column selection circuit 13 and the row selection circuit 15, based on the address A.

When the write enable signal WE is at a high level, the control circuit 12 outputs, to the column driver 14 and the row driver 16, a driver setting signal $S_{ds}$ for writing input data.

When the read enable signal RE is at a high level, the control circuit 12 outputs, to the column driver 14 and the row driver 16, a driver setting signal $S_{ds}$ for reading data, and outputs a readout circuit control signal $S_{rcc}$ to the readout circuit 17. The control circuit 12 receives data output IQ from the readout circuit 17, and outputs data output Q to the outside.

The column selection circuit 13 (also referred to as a first selection circuit) selects a desired column selection line, based on the address pre-decode signal $S_{apd}$. The column selection circuit 13 outputs, to the column driver 14, a decoded signal (also referred to as a first decoded signal) for selecting the control line PH.

The column driver 14 (also referred to as a first driver) supplies, to a switch cell, a write voltage or a read voltage via the control line PH according to the decoded signal from the column selection circuit 13.

The row selection circuit 15 (also referred to as a second selection circuit) selects a desired row selection line, based on the address pre-decode signal $S_{apd}$. The row selection circuit 15 outputs, to the row driver 16, a decoded signal (also referred to as a second decoded signal) for selecting the control line PV and the control line PB.

The row driver 16 (also referred to as a second driver) supplies, to the switch cell, a write voltage or a read voltage via the control line PV according to the decoded signal from the row selection circuit 15. The row driver 16 supplies a write voltage or a read voltage via the control line PB.

The readout circuit 17 senses a resistance state of the switch cell via the control line PB. The readout circuit 17 outputs data output IQ to the control circuit 12.

For example, the control circuit 12 outputs the address pre-decode signal $S_{apd}$ for selecting a desired switch cell, based on the address A (address signal) included in a signal from the configuration circuit 20. The column selection circuit 13 (first selection circuit) selects a column selection line (first selection line) to which the desired switch cell is connected, based on the address pre-decode signal $S_{apd}$, and outputs a decoded signal (first decoded signal) for selecting the control line PH (first control line). The column driver 14 (first driver) supplies, to the control line PH (first control line), a voltage according to the decoded signal (first decoded signal) from the column selection circuit 13 (first selection circuit). The row selection circuit 15 (second selection circuit) selects a row selection line (second selection line) to which the desired switch cell is connected, based on the address pre-decode signal $S_{apd}$, and outputs a decoded signal (second decoded signal) for selecting the control line PV (second control line). The row driver 16 (second driver) supplies, to the control line PV (second control line), a voltage according to the decoded signal (second decoded signal) from the row selection circuit 15 (second selection circuit). The readout circuit 17 senses a resistance state of the switch cell via the control line PB (third control line), and outputs read output data to the control circuit 12.

Next, a connection relation of the switch cell array 11 is described.

The first wiring VL0 is connected to the control line PV via the transistor NV0. A gate of the transistor NV0 is connected to the column selection line CSEL0. The first wiring VL1 is connected to the control line PV via the transistor NV1. A gate of the transistor NV1 is connected to the column selection line CSEL1. The column selection circuit 13 conducts the desired transistors (NV0 and NV1) via the column selection lines (CSEL0 and CSEL1), and connects the desired first wirings (VL0 and VL1) and the control line PV.

The second wiring HL0 is connected to the control line PH via the transistor NH0. A gate of the transistor NH0 is connected to the row selection line RSEL0. The second wiring HL1 is connected to the control line PH via the transistor NH1. A gate of the transistor NH1 is connected to the row selection line RSEL1. The row selection circuit 15 conducts the desired transistors (NH0 and NH1) via the row selection lines (RSEL0 and RSEL1), and connects the desired second wirings (HL0 and HL1) and the control line PH.

The bit line BL0 is connected to the control line PB via the transistor NB0. A gate of the transistor NB0 is connected to the column selection line CSEL_OR01. The column selection circuit 13 conducts the desired transistor NB0 via the column selection line CSEL_OR01, and connects the desired bit line BL0 and the control line PB.

Next, a connection relation of a switch cell is described. Herein, description is made based on an example of the switch cell SC00. Since a configuration of the switch cell SC11 is similar to the switch cell SC00, description thereof is omitted.

The switch cell SC00 includes a first resistance-changing element U00, a second resistance-changing element L00, and a cell transistor N00.

One terminal of the first resistance-changing element U00 is connected to the second wiring HL0. The other terminal of the first resistance-changing element U00 is connected to one terminal of the second resistance-changing element L00. The one terminal of the second resistance-changing element L00 is connected to the other terminal of the first resistance-changing element U00. The other terminal of the second resistance-changing element L00 is connected to the first wiring VL0. The other terminal of the first resistance-changing element U00 and the one terminal of the second resistance-changing element L00 form a shared node (also referred to as a shared terminal). The shared node is connected to a source or a drain of the cell transistor N00.

The drain or the source of the cell transistor N00 is connected to the bit line BL0. A gate of the cell transistor N00 is connected to the row selection line RSEL0. The row selection circuit 15 conducts the cell transistor N00 via the row selection line RSEL0, and connects the shared node and the bit line BL0. In other words, the shared node is connected to the bit line BL0 via the cell transistor N00. A unit element constituted of the serially-connected first resistance-changing element U00 and second resistance-changing element L00 functions as a three-terminal resistance-changing switch.

[Resistance-Changing Element]

In this section, a specific configuration of the first resistance-changing element U00 and the second resistance-changing element L00 is described by citing one example.

For example, it is possible to achieve the first resistance-changing element U00 and the second resistance-changing element L00 by a resistance variable nonvolatile memory element for use in a conductive bridge random access memory (CBRAM).

Figure 3:
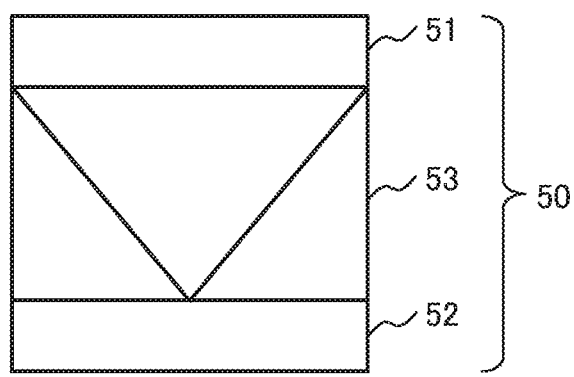
FIG. 3 is a conceptual diagram illustrating one example of a resistance-changing element for use in the programmable logic core included in the logic integrated circuit according to the first example embodiment of the present invention.

FIG. 3 is a configuration example of a resistance-changing element 50. The resistance-changing element 50 in FIG. 3 has such a structure that a resistance-changing layer 53 is sandwiched by a first electrode 51 being an active electrode, and a second electrode 52 being an inactive electrode. For example, the resistance-changing layer 53 of the resistance-changing element 50 can be achieved by a bipolar resistance-changing element of a metal bridge type using an ion conductor.

Figure 4:
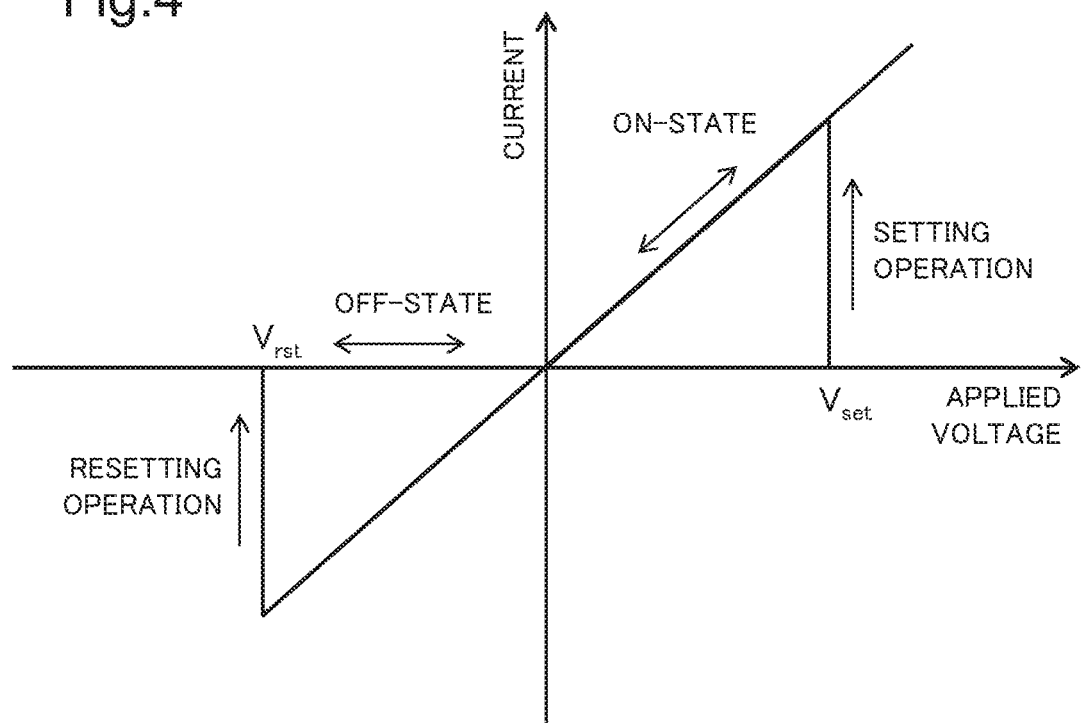
FIG. 4 is a schematic diagram for describing a setting operation and a resetting operation of the resistance-changing element for use in the programmable logic core included in the logic integrated circuit according to the first example embodiment of the present invention.

FIG. 4 is a schematic diagram for describing a state change of a resistance-changing switch using an ion conductor having a configuration of FIG. 3.

When the second electrode 52 being an inactive electrode is grounded, and a positive voltage is applied to the first electrode 51 being an active electrode, metal of the first electrode 51 being an active electrode turns into metal ions, and dissolves in the resistance-changing layer 53 being an ion conductive layer. The metal ions within the resistance-changing layer 53 precipitate as metal within the resistance-changing layer 53. The metal precipitated within the resistance-changing layer 53 forms a metal bridge for connecting the first electrode 51 and the second electrode 52. By the metal bridge, the first electrode 51 and the second electrode 52 are connected, and a low resistance state is achieved.

On the other hand, in a low resistance state, when the second electrode 52 being an inactive electrode is grounded, and a negative voltage is applied to the first electrode 51 being an active electrode, the metal bridge dissolve in the resistance-changing layer 53, and a part of the metal bridge is cut off. Consequently, connection of the first electrode 51 and the second electrode 52 is cut off, and a high resistance state is achieved. In order to set the resistance-changing switch from a high resistance state to a low resistance state again, it is only required to ground the inactive electrode again, and apply a positive voltage to the first electrode 51 being an active electrode.

In this way, by switching a resistance state of the resistance-changing switch between a low resistance state and a high resistance state, it is possible to achieve an ON-state and an OFF-state of the switch.

In the resistance-changing switch having the configuration of FIG. 3, a transient state occurs in which a resistance between the electrodes gradually decreases, a capacity between the electrodes changes, or the like at a stage before the electrodes are connected by a metal bridge, and finally, the electrodes are connected and a low resistance state is achieved. In the resistance-changing switch having the configuration of FIG. 3, a transient state occurs in which a resistance between the electrodes gradually increases, a capacity between the electrodes changes, or the like at a stage before connection by a metal bridge is cut off, and finally, the electrodes are disconnected and a high resistance state is achieved. In the resistance-changing switch having the configuration of FIG. 3, it is also possible to provide an intermediate state between the low resistance state and the high resistance state by using the transient state.

For example, the first resistance-changing element U00 and the second resistance-changing element L00 can be achieved by a resistance-changing element for use in a phase change random access memory (PRAM), a resistance random access memory (ReRAM), or the like.

The first resistance-changing element U00 and the second resistance-changing element L00 have two resistance states, namely, a low resistance state and a high resistance state. In the present description, a low resistance state is defined as an ON-state, and a high resistance state is defined as an OFF-state. When a resistance-changing switch is in an ON-state, a signal to be given at a voltage level passes through the resistance-changing switch. On the other hand, when the resistance-changing switch is in an OFF-state, the signal is blocked by the resistance-changing switch, and does not pass through the resistance-changing switch. Resistance states of the first resistance-changing element U00 and the second resistance-changing element L00 are associated with data 1 and 0 of configuration information (respectively, referred to as data 1 and data 0). A low resistance state is defined as data 1, and a high resistance state is defined as data 0.

Figure 5:
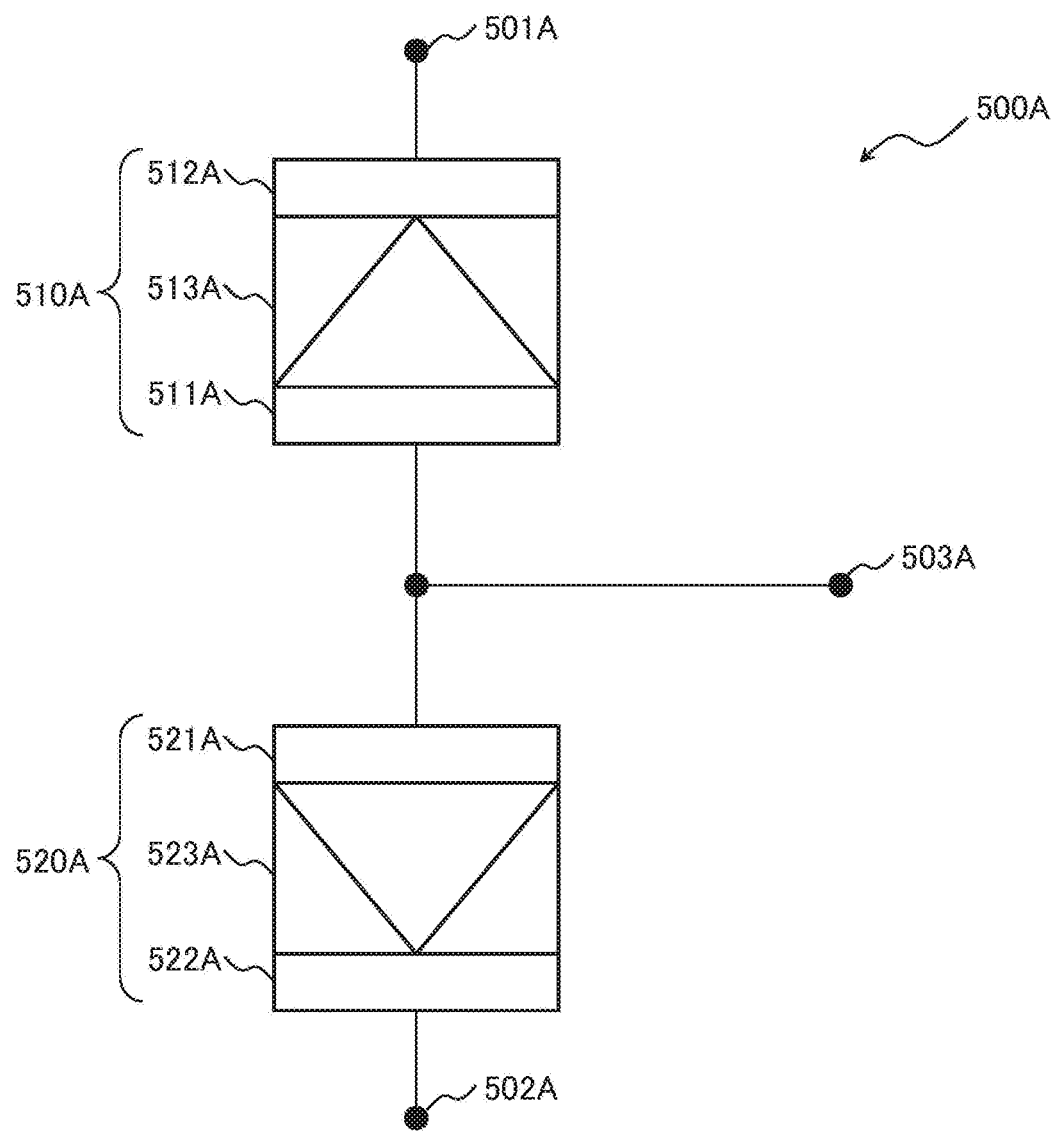
FIG. 5 is a conceptual diagram illustrating one example of a resistance-changing switch for use in the programmable logic core included in the logic integrated circuit according to the first example embodiment of the present invention.

FIG. 5 is a configuration example of a three-terminal resistance-changing switch 500A for achieving the switch cells (SC00 and SC11) illustrated in FIG. 2. The three-terminal resistance-changing switch 500A includes a resistance-changing element 510A and a resistance-changing element 520A. The resistance-changing element 510A includes a first electrode 511A, a second electrode 512A, and a resistance-changing layer 513A. The resistance-changing element 520A includes a first electrode 521A, a second electrode 522A, and a resistance-changing layer 523A. The first electrode 511A of the resistance-changing element 510A, and the first electrode 521A of the resistance-changing element 520A are connected, and form a shared node 503A. The second electrode 512A of the resistance-changing element 510A is connected to a first terminal 501A. The second electrode 522A of the resistance-changing element 520A is connected to a second terminal 502A.

The resistance-changing element 510A and the resistance-changing element 520A have symmetrical polarities with respect to the shared node 503A.

When the above-described configuration is brought into correspondence with the switch cell SC00 in FIG. 2, the first resistance-changing element U00 corresponds to the resistance-changing element 510A, and the second resistance-changing element L00 corresponds to the resistance-changing element 520A. Specifically, in the configuration of FIG. 2, the first resistance-changing element U00 and the second resistance-changing element L00 have symmetrical polarities with respect to the shared node.

In the configuration of FIG. 2, a second electrode (corresponding to the second electrode 512A) of the first resistance-changing element U00 is connected to the second wiring HL0. A second electrode (corresponding to the second electrode 522A) of the second resistance-changing element L00 is connected to the first wiring VL0.

It is defined that the switch cell SC00 is turned on, when the first resistance-changing element U00 and the second resistance-changing element L00 are in an ON-state, and is turned off, when the first resistance-changing element U00 and the second resistance-changing element L00 are in an OFF-state.

Figure 6:
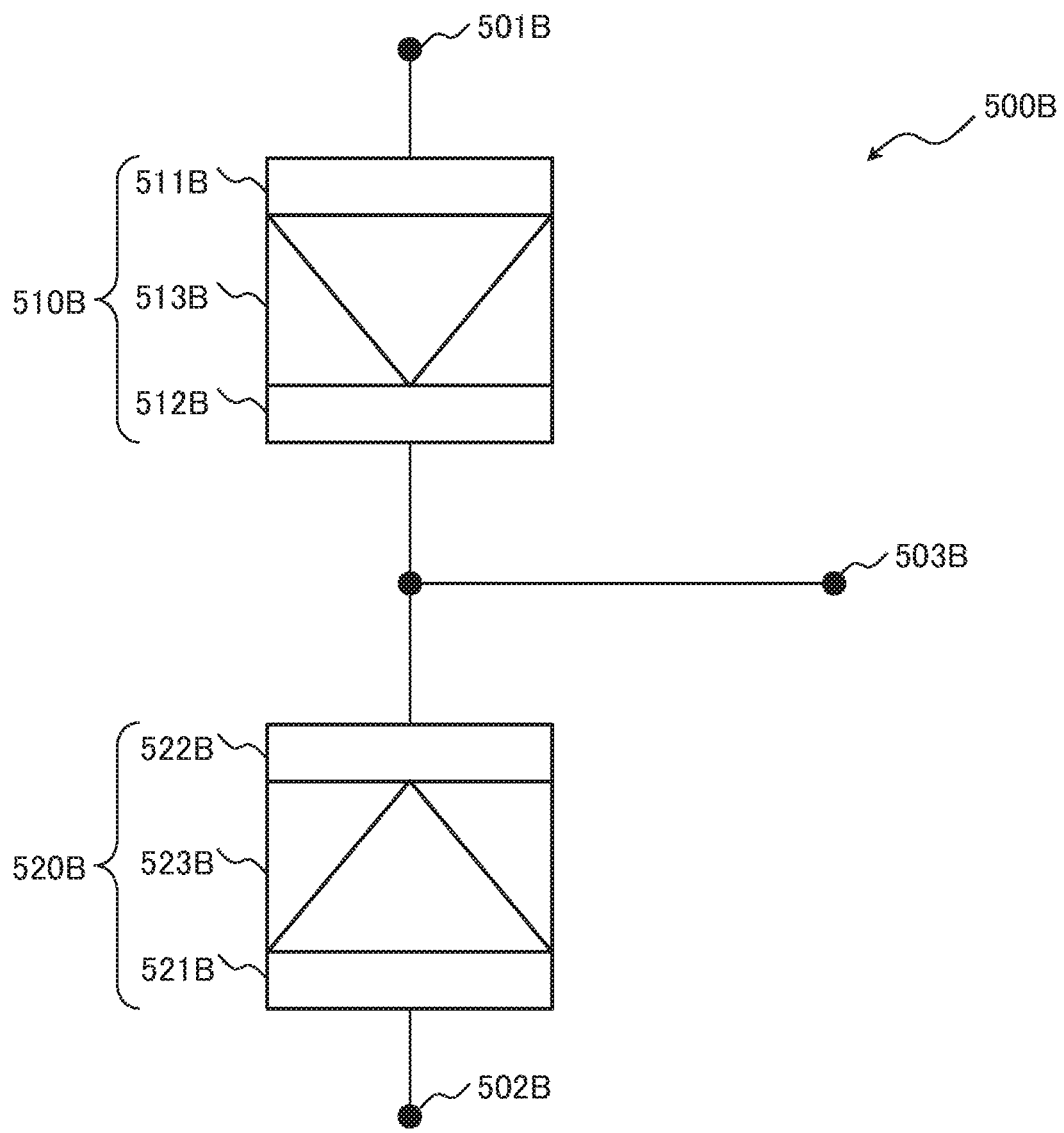
FIG. 6 is a conceptual diagram illustrating another example of the resistance-changing switch for use in the programmable logic core included in the logic integrated circuit according to the first example embodiment of the present invention.

FIG. 6 illustrates a configuration of another three-terminal resistance-changing switch 500B for achieving the switch cell SC00 illustrated in FIG. 2. The three-terminal resistance-changing switch 500B includes a resistance-changing element 510B and a resistance-changing element 520B. The resistance-changing element 510B includes a first electrode 511B, a second electrode 512B, and a resistance-changing layer 513B. The resistance-changing element 520B includes a first electrode 521B, a second electrode 522B, and a resistance-changing layer 523B. The second electrode 512B of the resistance-changing element 510B, and the second electrode 522B of the resistance-changing element 520B are connected, and form a shared node 503B. The first electrode 511B of the resistance-changing element 510B is connected to a first terminal 501B. The first electrode 521B of the resistance-changing element 520B is connected to a second terminal 502B. The resistance-changing element 510B and the resistance-changing element 520B have symmetrical polarities with respect to the shared node 503B.

[Writing Method_Set]

Next, a switch cell writing method is described by exemplifying the switch cell SC00. In the following example, a switch cell having a configuration of FIG. 5 is described. In a switch cell having the configuration of FIG. 6, a voltage according to a polarity of a resistance-changing switch may be set, and writing of the switch cell may be performed.

First, an example in which the switch cell SC00 is set from an OFF-state to an ON-state is described.

In first processing, the first resistance-changing element U00 is set from an OFF-state to an ON-state. Specifically, the column driver 14 applies a low voltage VL to the control line PH. The row driver 16 applies, to the control line PB, a high voltage VH equal to or higher than a set voltage. The row selection circuit 15 conducts the transistor NH0 via the row selection line RSEL0, and applies the low voltage VL to the second wiring HL0. The column selection circuit 13 conducts the transistor NB0 via the column selection line CSEL_OR01, and applies the high voltage VH to the bit line BL0. The row selection circuit 15 conducts the cell transistor N00 via the row selection line RSEL0, and applies the high voltage VH to a first electrode (shared node) of the first resistance-changing element U00. Consequently, the first resistance-changing element U00 is set to an ON-state.

The row driver 16 may apply an intermediate voltage (VH+VL)/2 or a high impedance to the control line PV. In this case, the column selection circuit 13 conducts the transistor NV0 via the column selection line CSEL0, and connects the control line PV and the first wiring VL0. At this occasion, since a voltage equal to or lower than the set voltage is applied to the second resistance-changing element L00, the second resistance-changing element L00 is kept in an OFF-state.

In second processing, the second resistance-changing element L00 is set from an OFF-state to an ON-state. Specifically, the row driver 16 applies a low voltage VL to the control line PV, and applies, to the control line PB, a high voltage VH equal to or higher than a set voltage. The column selection circuit 13 conducts the transistors (NV0 and NB0) via the column selection lines (CSEL0 and CSEL_OR01), applies the low voltage VL to the first wiring VL0, and applies the high voltage VH to the bit line BL0. The row selection circuit 15 conducts the cell transistor N00 via the row selection line RSEL0, and applies the high voltage VH to the first electrode (shared node) of the second resistance-changing element L00. Consequently, the second resistance-changing element L00 is set to an ON-state.

The column driver 14 may apply an intermediate voltage (VH+VL)/2 or a high impedance to the control line PH. In this case, the row selection circuit 15 conducts the transistor NH0 via the row selection line RSEL0, and connects the control line PH and the second wiring HL0. At this occasion, since a voltage equal to or lower than the set voltage is applied to the first resistance-changing element U00, the first resistance-changing element U00 is kept in an ON-state.

By the above-described first and second processing, the first resistance-changing element U00 and the second resistance-changing element L00 are set, and the switch cell SC00 is turned on.

[Writing Method_Reset]

Next, an example in which the switch cell SC00 is reset from an ON-state to an OFF-state is described.

In first processing, the first resistance-changing element U00 is reset from an ON-state to an OFF-state. Specifically, the column driver 14 applies, to the control line PH, a high voltage VH equal to or higher than a reset voltage. The row driver 16 applies a low voltage VL to the control line PB. The row selection circuit 15 conducts the transistor NH0 via the row selection line RSEL0, and applies a high voltage VH to the second wiring HL0. The column selection circuit 13 conducts the transistor NB0 via the column selection line CSEL_OR01, and applies the low voltage VL to the bit line BL0. The row selection circuit 15 conducts the cell transistor N00 via the row selection line RSEL0, and applies the low voltage VL to the first electrode (shared node) of the first resistance-changing element U00. Consequently, the first resistance-changing element U00 is set to an OFF-state.

The row driver 16 may apply an intermediate voltage (VH+VL)/2 or a high impedance to the control line PV. In this case, the column selection circuit 13 conducts the transistor NV0 via the column selection line CSEL0, and connects the control line PV and the first wiring VL0. Since a voltage equal to or lower than the reset voltage is applied to the second resistance-changing element L00, the second resistance-changing element L00 is kept in an ON-state.

In second processing, the second resistance-changing element L00 is reset from an ON-state to an OFF-state. Specifically, the row driver 16 applies, to the control line PV, a high voltage VH equal to or higher than a reset voltage, and applies a low voltage VL to the control line PB. The column selection circuit 13 conducts the transistors (NV0 and NB0) via the column selection lines (CSEL0 and CSEL_OR01), applies the high voltage VH to the first wiring VL0, and applies the low voltage VL to the bit line BL0. The row selection circuit 15 conducts the cell transistor N00 via the row selection line RSEL0, and applies the low voltage VL to a first electrode (shared node) of the second resistance-changing element L00. Consequently, the second resistance-changing element L00 is set to an OFF-state.

The column driver 14 may apply an intermediate voltage (VH+VL)/2 or a high impedance to the control line PH. In this case, the row selection circuit 15 conducts the transistor NH0 via the row selection line RSEL0, and connects the control line PH and the second wiring HL0. Since a voltage equal to or lower than the reset voltage is applied to the first resistance-changing element U00, the first resistance-changing element U00 is kept in an OFF-state.

By the above-described first and second processing, the first resistance-changing element U00 and the second resistance-changing element L00 are reset, and the switch cell SC00 is turned off.

[Reading Method]

Next, a switch cell reading method is described. In this section, an example in which a state of the switch cell SC00 is read is described.

In first processing, a resistance state of the first resistance-changing element U00 is read. Specifically, the column driver 14 applies a low voltage VL to the control line PH. The readout circuit 17 applies a sensing voltage VS to the control line PB. The row driver 16 applies a high impedance to the control line PV. The row selection circuit 15 conducts the transistor NH0 via the row selection line RSEL0, and applies the low voltage VL to the second wiring HL0. The column selection circuit 13 conducts the transistor NB0 via the column selection line CSEL_OR01, and applies the sensing voltage VS to the bit line BL0. The row selection circuit 15 conducts the cell transistor N00 via the row selection line RSEL0, and applies the sensing voltage VS to the first electrode (shared node) of the first resistance-changing element U00. Consequently, sensing current flows according to a resistance state of the first resistance-changing element U00.

For example, after converting the sensing current into a voltage, the readout circuit 17 compares the voltage after conversion with a reference voltage, and thereby determines a resistance state of the first resistance-changing element U00. For example, the readout circuit 17 outputs, as data output IQ, data 1 when a resistance value is smaller than a predetermined value, and data 0 when a resistance value is larger than the predetermined value.

In second processing, a resistance state of the second resistance-changing element L00 is read. Specifically, the row driver 16 applies a low voltage VL to the control line PV. The readout circuit 17 applies a sensing voltage VS to the control line PB. The column driver 14 applies a high impedance to the control line PH. The column selection circuit 13 conducts the transistors (NV0 and NB0) via the column selection lines (CSEL0 and CSEL_OR01), applies the low voltage VL to the first wiring VL0, and applies the sensing voltage VS to the bit line BL0. The row selection circuit 15 conducts the cell transistor N00 via the row selection line RSEL0, and applies the sensing voltage VS to the first electrode (shared node) of the second resistance-changing element L00. Consequently, sensing current flows according to a resistance state of the second resistance-changing element L00.

For example, after converting the sensing current into a voltage, the readout circuit 17 compares the voltage after conversion with a reference voltage, and thereby determines a resistance state of the second resistance-changing element L00. For example, the readout circuit 17 outputs, as data output IQ, data 1 when a resistance value is smaller than a predetermined value, and data 0 when a resistance value is larger than the predetermined value.

The control circuit 12 outputs, as data output Q, data output IQ output from the readout circuit 17. For example, the control circuit 12 may compare data read out from the first resistance-changing element U00 with data read out from the second resistance-changing element L00, and thereby perform error determination of data read out from a switch cell.

[Transistor Layer]

Figure 7:
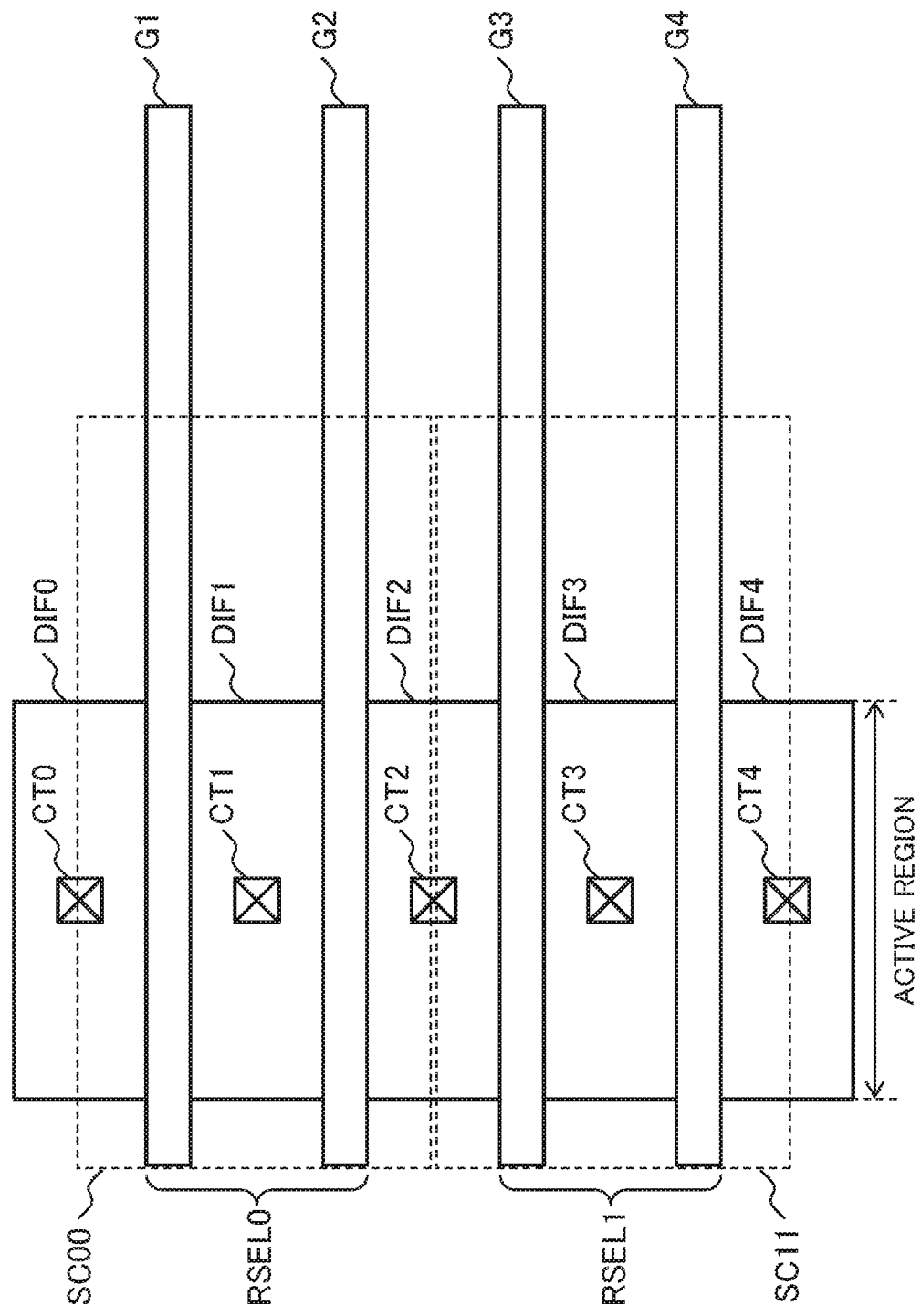
FIG. 7 is a schematic diagram illustrating one example of a switch cell array on a transistor layer of the logic integrated circuit according to the first example embodiment of the present invention.

Next, the switch cell array 11 on a transistor layer of the logic integrated circuit 1 according to the present example embodiment is described with reference to a drawing. FIG. 7 is a schematic diagram illustrating the switch cell array 11 on a transistor layer of the logic integrated circuit 1. FIG. 7 exemplifies a case where the switch cell array 11 on the transistor layer is constituted of the switch cell SC00 and the switch cell SC11. The switch cell array 11 includes an active region where a transistor is formed.

The switch cell SC00 includes an N-type transistor constituted of a diffusion layer DIF0, a diffusion layer DIF1, a diffusion layer DIF2, a gate electrode G1, a gate electrode G2, a contact CT0, a contact CT1, and a contact CT2. The two gate electrodes (G1 and G2) function as the row selection line RSEL0, and a high voltage is applied thereto, when the switch cell SC00 is selected. Specifically, the switch cell SC00 is connected to the row selection line RSEL0 constituted of the two gate electrodes (G1 and G2).

The switch cell SC11 includes an N-type transistor constituted of the diffusion layer DIF2, a diffusion layer DIF3, a diffusion layer DIF4, a gate electrode G3, a gate electrode G4, the contact CT2, a contact CT3, and a contact CT4. The two gate electrodes (G3 and G4) function as the row selection line RSEL1, and a high voltage is applied thereto, when the switch cell SC11 is selected. Specifically, the switch cell SC10 is connected to the row selection line RSEL1 constituted of the two gate electrodes (G3 and G4).

As illustrated in FIG. 7, in the switch cell array 11, since the switch cell SC00 and the switch cell SC11 share the diffusion layer DIF2, a compact layout is achieved.

[Wiring Layer]

Figure 8:
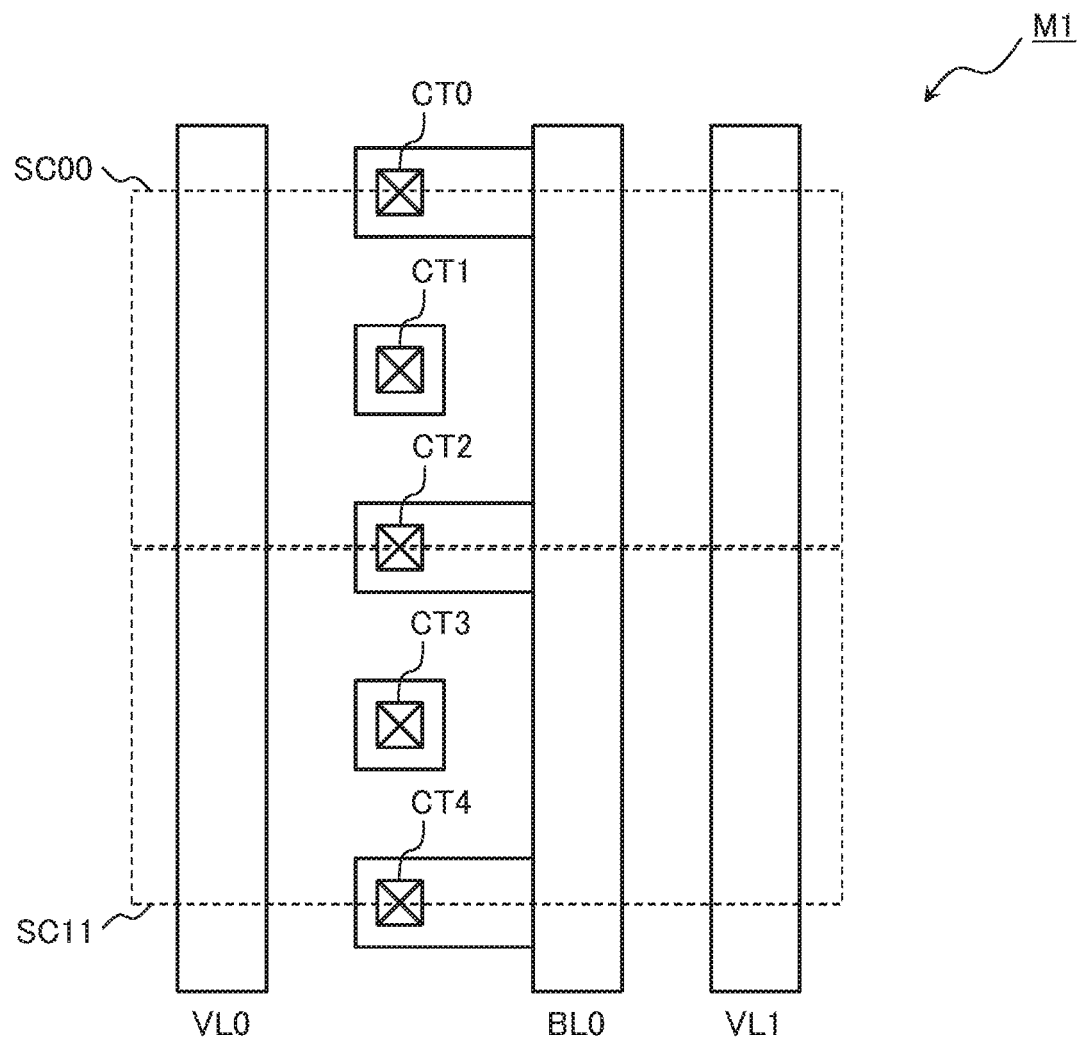
FIG. 8 is a schematic diagram illustrating one example of the switch cell array on a first wiring layer of the logic integrated circuit according to the first example embodiment of the present invention.
Figure 9:
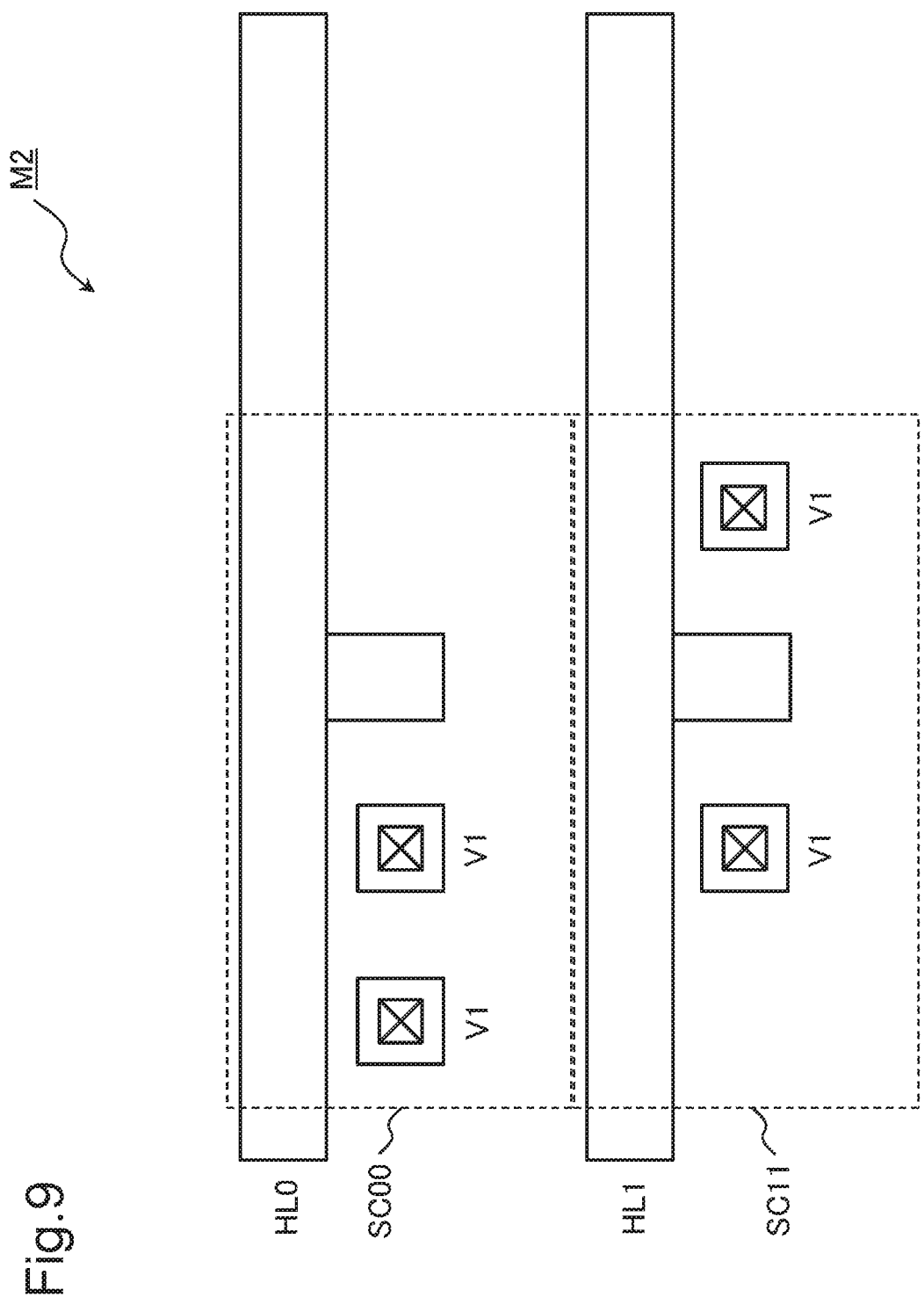
FIG. 9 is a schematic diagram illustrating one example of the switch cell array on a second wiring layer of the logic integrated circuit according to the first example embodiment of the present invention.
Figure 10:
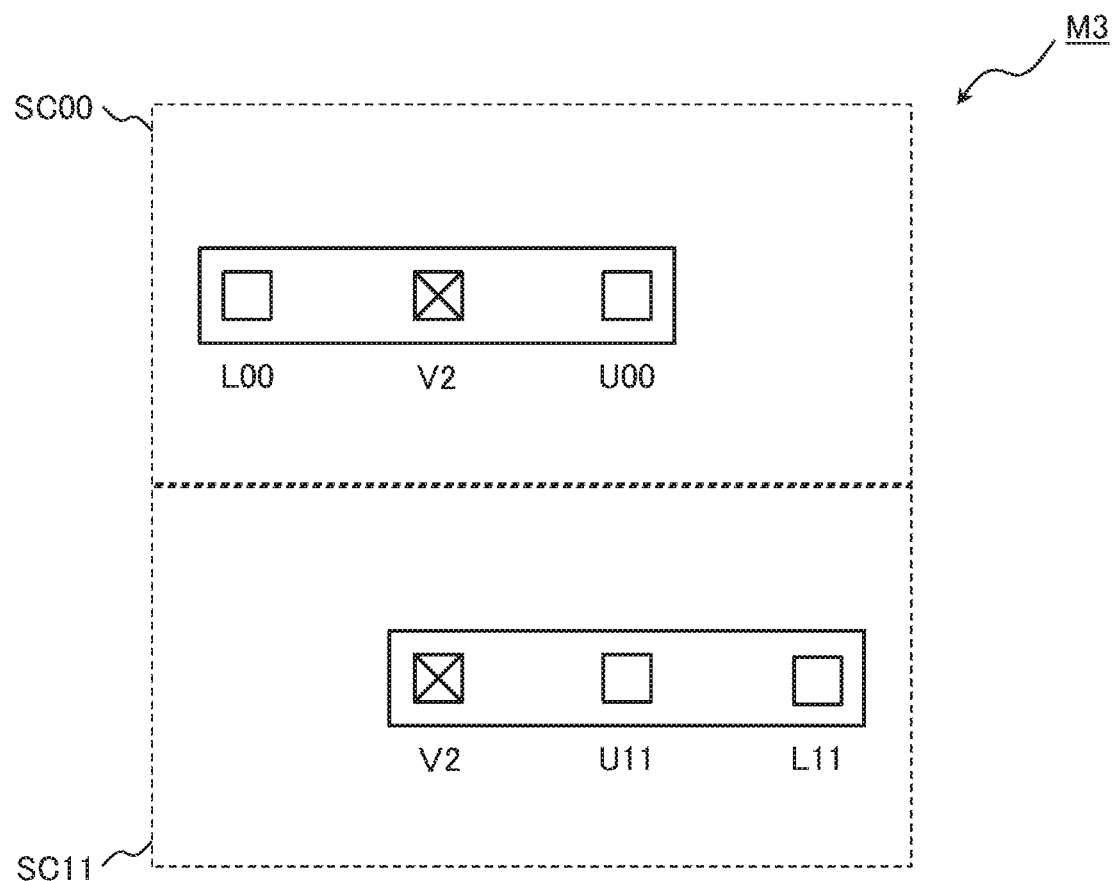
FIG. 10 is a schematic diagram illustrating one example of the switch cell array on a third wiring layer of the logic integrated circuit according to the first example embodiment of the present invention.

Next, the switch cell array 11 on a wiring layer of the logic integrated circuit 1 according to the present example embodiment is described with reference to the drawings. FIGS. 8 to 10 are schematic diagrams illustrating the switch cell array 11 on a wiring layer of the logic integrated circuit 1. FIGS. 8 to 10 exemplify a case where the switch cell array 11 on a wiring layer is constituted of the switch cell SC00 and the switch cell SC11.

FIG. 8 illustrates a first wiring layer M1. As illustrated in FIG. 8, the first wirings (VL0 and VL1) and the bit line BL0 are formed on the first wiring layer M1. The contacts (CT0 to 4) connect the first wiring layer M1 and the diffusion layers (DIF0 to 4).

FIG. 9 illustrates a second wiring layer M2. As illustrated in FIG. 9, the second wirings (HL0 and HL1) are formed on the second wiring layer M2. A via V1 connects the second wiring layer M2 and the first wiring layer M1.

FIG. 10 illustrates a third wiring layer M3. A via V2 connects the third wiring layer M3 and the second wiring layer M2. The first resistance-changing elements (U00 and U11) and the second resistance-changing elements (L00 and L11) are formed between the third wiring layer M3 and the second wiring layer M2.

The bit line BL0 is connected to the switch cell SC00 and the switch cell SC11. The first wiring VL0 is connected to the switch cell SC00. The first wiring VL1 is connected to the switch cell SC11. The second wiring HL0 is connected to the switch cell SC00. The second wiring HL1 is connected to the switch cell SC11.

In the switch cell SC00, the bit line BL0 is connected to the diffusion layer DIF0 via the contact CT0, and is connected to the diffusion layer DIF2 via the contact CT2. The first wiring VL0 is connected to one terminal of the second resistance-changing element L00. The other terminal of the second resistance-changing element L00 is connected to the diffusion layer DIF1 via the third wiring layer M3, and forms a shared node. The second wiring HL0 is connected to one terminal of the first resistance-changing element U00. The other terminal of the first resistance-changing element U00 is connected to the diffusion layer DIF1 via the third wiring layer M3, and forms a shared node.

As described above, a logic integrated circuit according to the present example embodiment is able to achieve a compact layout by causing switch cells to be connected to different first wiring layers to share a bit line, and causing switch cells adjacent to each other in the column direction to share a diffusion layer.

The logic integrated circuit according to the present example embodiment is able to reduce the number of elements to be connected to a first wiring, and individually control different column selection lines. Therefore, it is possible to reduce the number of elements to which a voltage is applied at a time of writing or a time of reading. Consequently, the logic integrated circuit according to the present example embodiment is able to suppress erroneous writing to an unintended bit at a time of writing, and suppress snake current at a time of reading. This enables enhancement of reliability.

Specifically, the present example embodiment is able to provide a logic integrated circuit having a reduced chip area.

Second Example Embodiment

Next, a logic integrated circuit according to a second example embodiment of the present invention is described with reference to the drawings. The logic integrated circuit according to the present example embodiment is different from the first example embodiment in a configuration of a programmable logic core. In the following drawings, components similar to those of the logic integrated circuit according to the first example embodiment are indicated with same reference signs. In the following description, description on a configuration and a function similar to those of the logic integrated circuit according to the first example embodiment is omitted.

Figure 11:
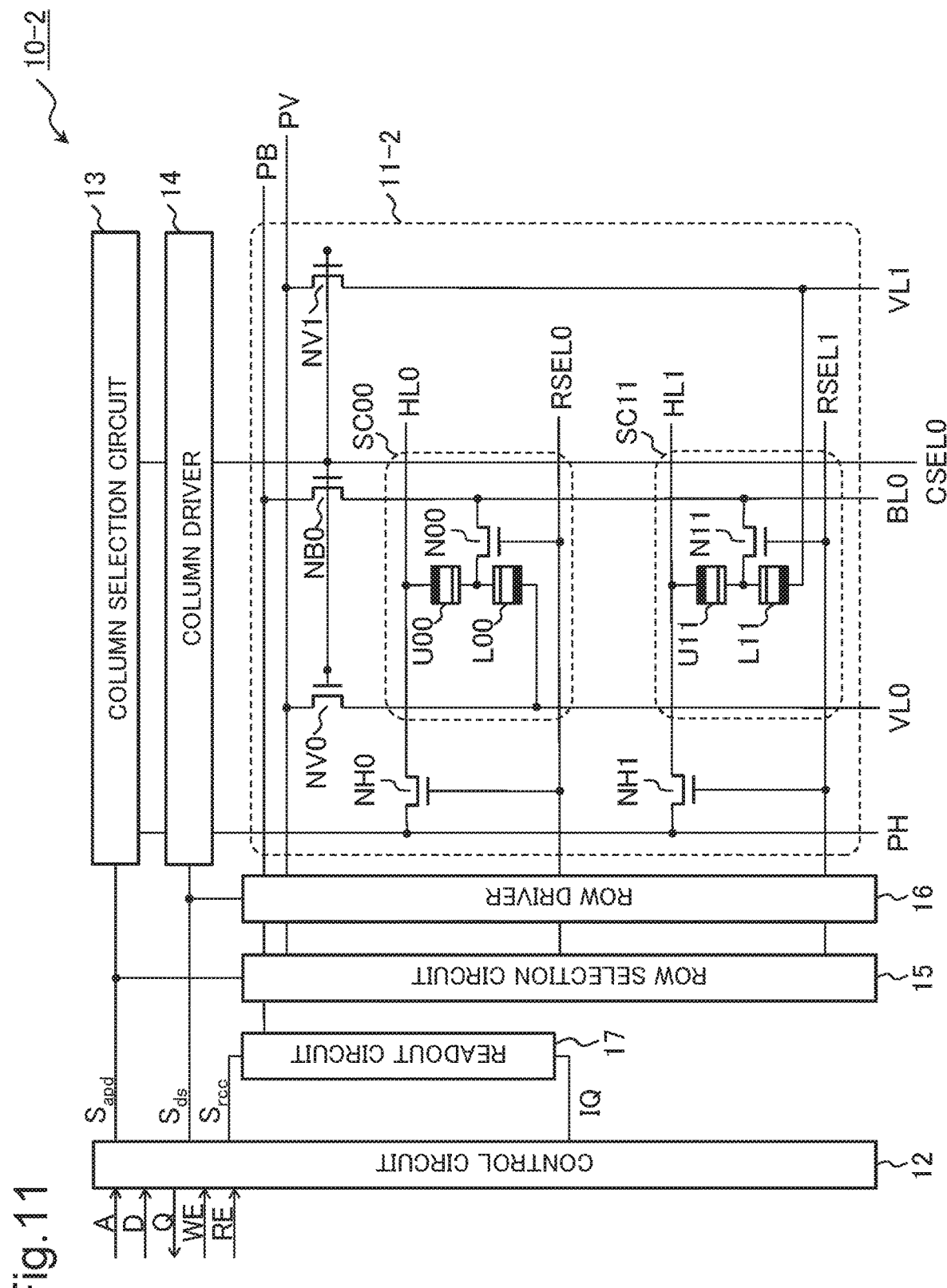
FIG. 11 is a schematic diagram illustrating a circuit configuration of a programmable logic core included in a logic integrated circuit according to a second example embodiment of the present invention.

FIG. 11 is a schematic diagram illustrating one example of a configuration of a programmable logic core 10-2 according to the present example embodiment. As illustrated in FIG. 11, the programmable logic core 10-2 includes a switch cell array 11-2, a control circuit 12, a column selection circuit 13, a column driver 14, a row selection circuit 15, a row driver 16, and a readout circuit 17. Since the control circuit 12, the column selection circuit 13, the column driver 14, the row selection circuit 15, the row driver 16, and the readout circuit 17 have a similar configuration as the first example embodiment, detailed description thereof is omitted.

In the programmable logic core 10-2 according to the present example embodiment, the three column selection lines (CCSEL0, CSEL1, and CSEL_OR01) in the programmable logic core 10 according to the first example embodiment are integrated into one column selection line CSEL0. Specifically, in the programmable logic core 10-2 according to the present example embodiment, the number of column selection lines (first selection lines) is small, as compared with the programmable logic core 10 according to the first example embodiment. Since the other configurations of the programmable logic core 10-2 according to the present example embodiment are similar to the first example embodiment, description on overlapping portions is omitted.

The switch cell array 11-2 includes a group of M wirings (where M is an integer of 2 or larger) extending in a row direction, and a group of N wirings (where N is an integer of 2 or larger) extending in a column direction. The switch cell array 11-2 includes first wirings (VL0 and VL1) extending in the column direction, and second wirings (HL0 and HL1) extending in the row direction. FIG. 11 illustrates a configuration example in which the switch cell array 11-2 includes two first wirings and two second wirings. However, there is no limitation on the numbers of the first wirings and the second wirings.

The switch cell array 11-2 includes switch cells (SC00 and SC11) for switching connection and disconnection of the first wirings (VL0 and VL1) and the second wirings (HL0 and HL1) at portions where the first wirings (VL0 and VL1) and the second wirings (HL0 and HL1) intersect with each other. In other words, the switch cell array 11-2 includes the switch cells (SC00 and SC11) for switching a connection state of the first wirings (VL0 and VL1) and the second wirings (HL0 and HL1) at intersection positions of the first wirings (VL0 and VL1) and the second wirings (HL0 and HL1). The switch cell array 11-2 can be constituted of N×M switch cells at maximum. In the example of FIG. 11, the switch cell array 11-2 includes the two switch cells (SC00 and SC11) at portions where the first wirings and the second wirings intersect with each other. FIG. 11 illustrates a case where there are two switch cells. However, there is no limitation on the number of switch cells.

The switch cell array 11-2 includes a column selection line CSEL0 and a bit line BL0 extending in the column direction, and row selection lines (RSEL0 and RSEL1) extending in the row direction. The switch cell array 11-2 includes a control line PH extending in the column direction, and a control line PV and a control line PB extending in the row direction. The switch cell array 11 further includes transistors (NV0, NV1, and NB0) disposed in the row direction, and transistors (NH0 and NH1) disposed in the column direction.

Next, a connection relation of the switch cell array 11-2 is described.

The first wiring VL0 is connected to the control line PV via the transistor NV0. A gate of the transistor NV0 is connected to the column selection line CSEL0. The first wiring VL1 is connected to the control line PV via the transistor NV1. A gate of the transistor NV1 is connected to the column selection line CSEL0. The column selection circuit 13 conducts the desired transistors (NV0 and NV1) via the column selection line CSEL0, and connects the desired first wirings (VL0 and VL1) and the control line PV.

The bit line BL0 is connected to the control line PB via the transistor NB0. A gate of the transistor NB0 is connected to the column selection line CSEL0. The column selection circuit 13 conducts the desired transistor (NB0) via the column selection line CSEL0, and connects the desired bit line BL0 and the control line PB.

Specifically, gates of the transistors (NV0, NV1, and NB0) are commonly connected to the column selection line CSEL0.

The second wiring HL0 is connected to the control line PH via the transistor NH0. A gate of the transistor NH0 is connected to the row selection line RSEL0. The second wiring HL1 is connected to the control line PH via the transistor NH1. A gate of the transistor NH1 is connected to the row selection line RSEL1. The row selection circuit 15 conducts the desired transistors (NH0 and NH1) via the row selection lines (RSEL0 and RSEL1), and connects the desired second wirings (HL0 and HL1) and the control line PH.

Regarding the two switch cells (SC00 and SC11) adjacent to each other in the column direction (first direction), gates of the transistors (NV0 and NV1) and the transistor (NB0) are connected to the common column selection line CSEL0. Gates of the transistors (NH0 and NH1) are connected to the different row selection lines (RSEL0 and RSEL1). The two switch cells (SC00 and SC11) are connected to the common column selection line CSEL0 via the transistors (NV0 and NV1) connected to the different first wirings (VL0 and VL1).

Writing and reading of the switch cells (SC00 and SC11) can be performed similarly to the switch cell array 11-2 according to the first example embodiment by operating the CSEL0 similarly to the CSEL_OR01 according to the first example embodiment.

As described above, in the logic integrated circuit according to the present example embodiment, three column selection lines in the first example embodiment are integrated into one. Consequently, in the logic integrated circuit according to the present example embodiment, since the number of wirings is reduced, a chip area can be reduced, as compared with the first example embodiment. In the switch cells (SC00 and SC11) of the logic integrated circuit according to the present example embodiment, a same voltage is applied to the first wirings (VL0 and VL1) in writing and reading. However, since row selection lines are different, it is possible to individually access the switch cells.

As described above, the present example embodiment is able to provide a logic integrated circuit having a further reduced chip area, as compared with the first example embodiment.

Related Arts

In this section, a logic integrated circuit of a related art according to each of the example embodiments of the present invention is described with reference to the drawings. In the following, first and second related arts are described. In the following drawings, components similar to those of the logic integrated circuit according to each of the example embodiments of the present invention are indicated with same reference signs. In the following description, description on a configuration and a function similar to those of the logic integrated circuit according to each of the example embodiments of the present invention is omitted.

First Related Art

Figure 12:
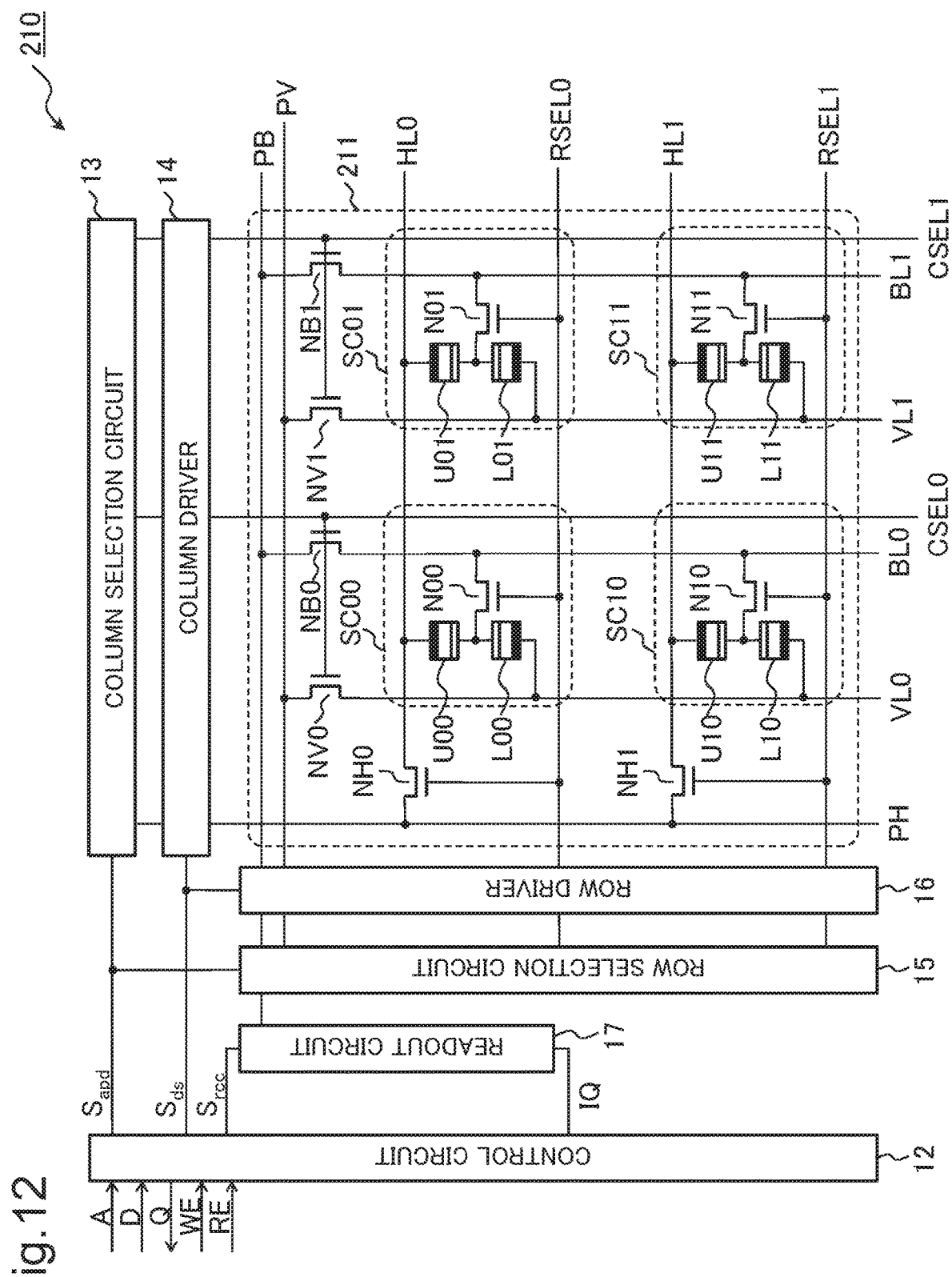
FIG. 12 is a schematic diagram illustrating a circuit configuration of a programmable logic core included in a logic integrated circuit according to a first related art.

FIG. 12 is a schematic diagram illustrating a circuit configuration of a programmable logic core 210 of a logic integrated circuit according to the first related art. As illustrated in FIG. 12, the programmable logic core 210 includes a switch cell array 211, a control circuit 12, a column selection circuit 13, a column driver 14, a row selection circuit 15, a row driver 16, and a readout circuit 17. Since the control circuit 12, the column selection circuit 13, the column driver 14, the row selection circuit 15, the row driver 16, and the readout circuit 17 have a configuration similar to the first example embodiment, detailed description thereof is omitted.

The switch cell array 211 includes a group of M wirings (where M is an integer of 2 or larger) extending in a row direction, and a group of N wirings (where N is an integer of 2 or larger) extending in a column direction. The switch cell array 211 includes first wirings (VL0 and VL1) extending in the column direction, and second wirings (HL0 and HL1) extending in the row direction. FIG. 12 illustrates a configuration example in which the switch cell array 211 includes two first wirings and two second wirings. However, there is no limitation on the numbers of the first wirings and the second wirings.

The switch cell array 211 includes switch cells for switching connection and disconnection of the first wirings (VL0 and VL1) and the second wirings (HL0 and HL1) at portions where the first wirings (VL0 and VL1) and the second wirings (HL0 and HL1) intersect with each other. In the example of FIG. 12, the switch cell array 211 includes four switch cells (SC00, SC01, SC10, and SC11) at portions where the first wirings (VL0 and VL1) and the second wirings (HL0 and HL1) intersect with each other. FIG. 12 illustrates a configuration example in which the switch cell array 211 includes four switch cells. However, there is no limitation on the number of switch cells.

The switch cell array 211 includes column selection lines (CSEL0 and CSEL1) extending in the column direction, and row selection lines (RSEL0 and RSEL1) extending in the row direction. The switch cell array 211 includes a control line PH, a bit line BL0, and a bit line BL1 extending in the column direction; and a control line PV and a control line PB extending in the row direction. The switch cell array 211 further includes transistors (NV0, NV1, NB0, and NB1) disposed in the row direction, and transistors (NH0 and NH1) disposed in the column direction.

The switch cell SC00 includes a first resistance-changing element U00, a second resistance-changing element L00, and a cell transistor N00. The switch cell SC01 includes a first resistance-changing element U01, a second resistance-changing element L10, and a cell transistor N01. The switch cell SC10 includes a first resistance-changing element U10, a second resistance-changing element L10, and a cell transistor N10. The switch cell SC11 includes a first resistance-changing element U11, a second resistance-changing element L11, and a cell transistor N11. Since a configuration of the switch cells (SC00, SC01, SC10, and SC11) is similar to the first example embodiment, detailed description thereof is omitted.

Next, a connection relation of the switch cell array 211 is described.

The first wiring VL0 is connected to the control line PV via the transistor NV0. A gate of the transistor NV0 is connected to the column selection line CSEL0. The first wiring VL1 is connected to the control line PV via the transistor NV1. A gate of the transistor NV1 is connected to the column selection line CSEL1. The column selection circuit 13 conducts the desired transistors (NV0 and NV1) via the column selection lines (CSEL0 and CSEL1), and connects the desired first wirings (VL0 and VL1) and the control line PV.

The second wiring HL0 is connected to the control line PH via the transistor NH0. A gate of the transistor NH0 is connected to the row selection line RSEL0. The second wiring HL1 is connected to the control line PH via the transistor NH1. A gate of the transistor NH1 is connected to the row selection line RSEL1. The row selection circuit 15 conducts the desired transistor (NH0 or NH1) via one of the row selection lines (RSEL0 and RSEL1), and connects the desired second wiring (HL0 or HL1) and the control line PH.

The bit line BL0 is connected to the control line PB via the transistor NB0. A gate of the transistor NB0 is connected to the column selection line CSEL0. The bit line BL1 is connected to the control line PB via the transistor NB1. A gate of the transistor NB1 is connected to the column selection line CSEL1. The column selection circuit 13 conducts the desired transistors (NB0 and NB1) by using the column selection lines (CSEL0 and CSEL1), and connects the desired bit lines (BL0 and BL1) and the control line PB.

Next, a connection relation of the switch cells (SC00, SC01, SC10, and SC11) is described. In this section, the switch cell SC00 is exemplarily described. Since a configuration of the switch cells (SC01, SC10, and SC11) is similar to the switch cell SC00, description thereof is omitted.

One terminal of the first resistance-changing element U00 is connected to the second wiring HL0. The other terminal of the first resistance-changing element U00 is connected to one terminal of the second resistance-changing element L00. The one terminal of the second resistance-changing element L00 is connected to the other terminal of the first-resistance changing element U00. The other terminal of the second resistance-changing element L00 is connected to the first wiring VL0. The other terminal of the first resistance-changing element U00 and the one terminal of the second resistance-changing element L00 form a shared node. The shared node is connected to a source or a drain of the cell transistor N00.

The drain or the source of the cell transistor N00 is connected to the bit line BL0. A gate of the cell transistor N00 is connected to the row selection line RSEL0. The row selection circuit 15 conducts the cell transistor N00 via the row selection line RSEL0, and connects the shared node and the bit line BL0. A unit element constituted of the serially-connected first resistance-changing element U00 and second resistance-changing element L00 functions as a three-terminal resistance-changing switch.

[Transistor Layer]

Figure 13:
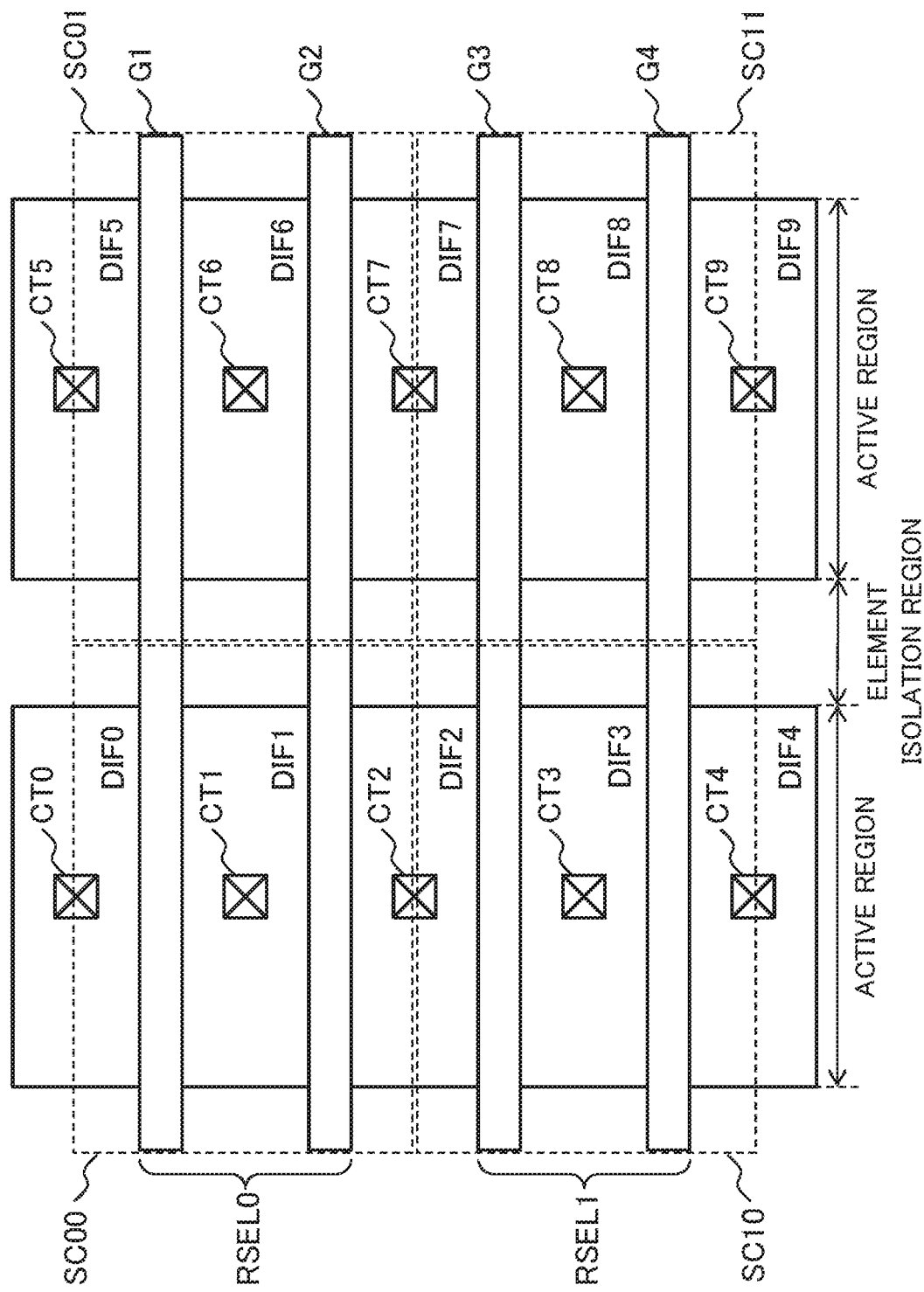
FIG. 13 is a schematic diagram illustrating one example of a switch cell array on a transistor layer of the logic integrated circuit according to the first related art.

Next, the switch cell array 211 on a transistor layer of the logic integrated circuit according to the first related art is described with reference to a drawing. FIG. 13 is a schematic diagram illustrating the switch cell array 211 on a transistor layer. FIG. 13 exemplifies a case where the switch cell array 211 is constituted of switch cells (SC00, SC10, SC01, and SC11) of two rows by two columns. The switch cell array 211 includes an active region on which a transistor is formed, and an element isolation region for isolating transistors.

The switch cell SC00 includes an N-type transistor constituted of a diffusion layer DIF0, a diffusion layer DIF1, a diffusion layer DIF2, a gate electrode G1, a gate electrode G2, a contact CT0, a contact CT1, and a contact CT2. The gate electrodes (G1 and G2) function as the row selection line RSEL0, and a high voltage is applied thereto, when the switch cell SC00 is selected.

The switch cell SC10 includes an N-type transistor constituted of the diffusion layer DIF2, a diffusion layer DIF3, a diffusion layer DIF4, a gate electrode G3, a gate electrode G4, the contact CT2, a contact CT3, and a contact CT4. The gate electrodes (G3 and G4) function as the row selection line RSEL1, and a high voltage is applied thereto, when the switch cell SC10 is selected.

The switch cell SC01 includes an N-type transistor constituted of a diffusion layer DIF5, a diffusion layer DIF6, a diffusion layer DIF7, the gate electrode G1, the gate electrode G2, a contact CT5, a contact CT6, and a contact CT7. The gate electrodes (G1 and G2) function as the row selection line RSEL0, and a high voltage is applied thereto, when the switch cell SC01 is selected.

The switch cell SC11 includes an N-type transistor constituted of the diffusion layer DIF7, a diffusion layer DIF8, a diffusion layer DIF9, the gate electrode G3, the gate electrode G4, the contact CT7, a contact CT8, and a contact CT9. The gate electrodes (G3 and G4) function as the row selection line RSEL1, and a high voltage is applied thereto, when the switch cell SC11 is selected.

[Wiring Layer]

Figure 14:
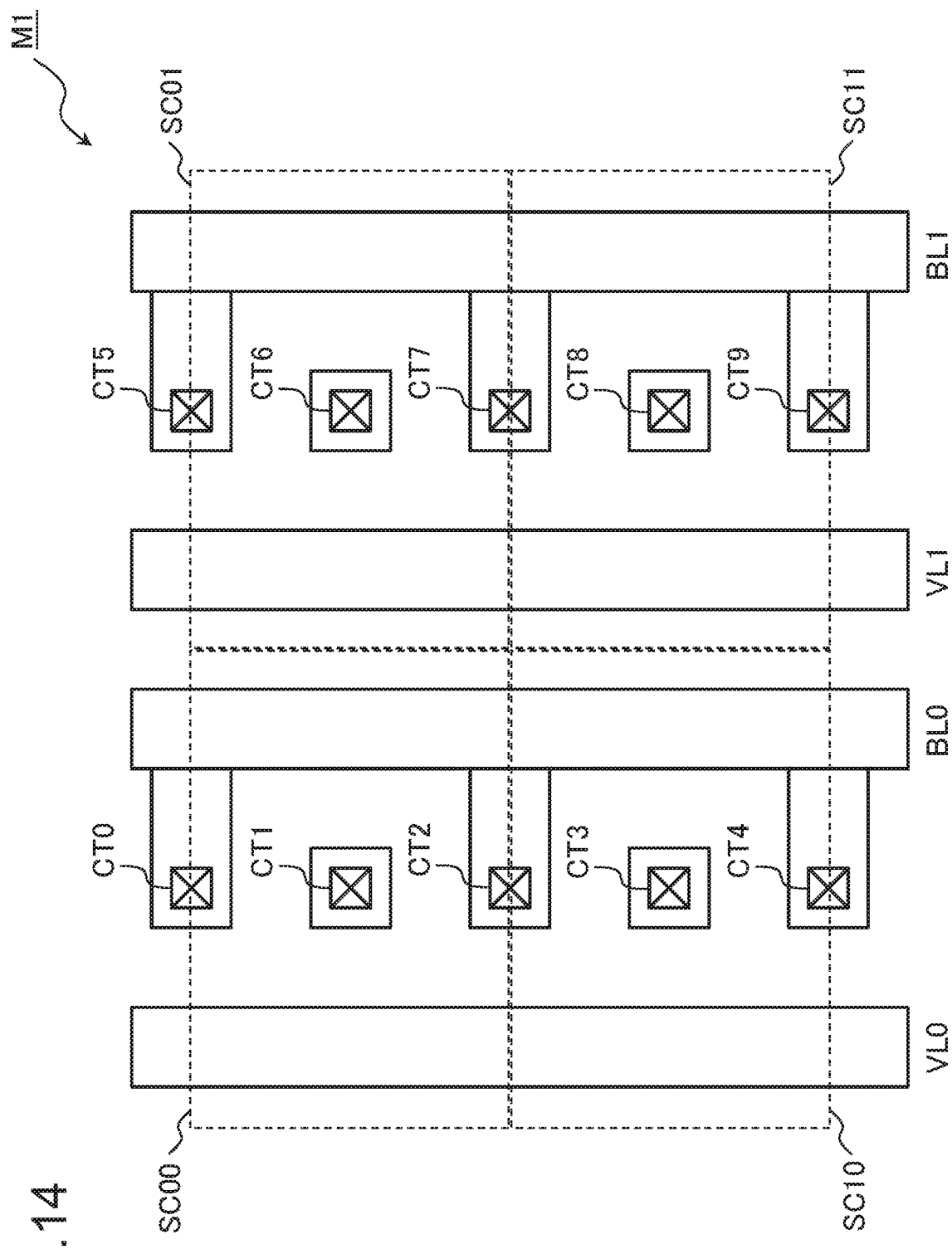
FIG. 14 is a schematic diagram illustrating one example of the switch cell array on a first wiring layer of the logic integrated circuit according to the first related art.
Figure 15:
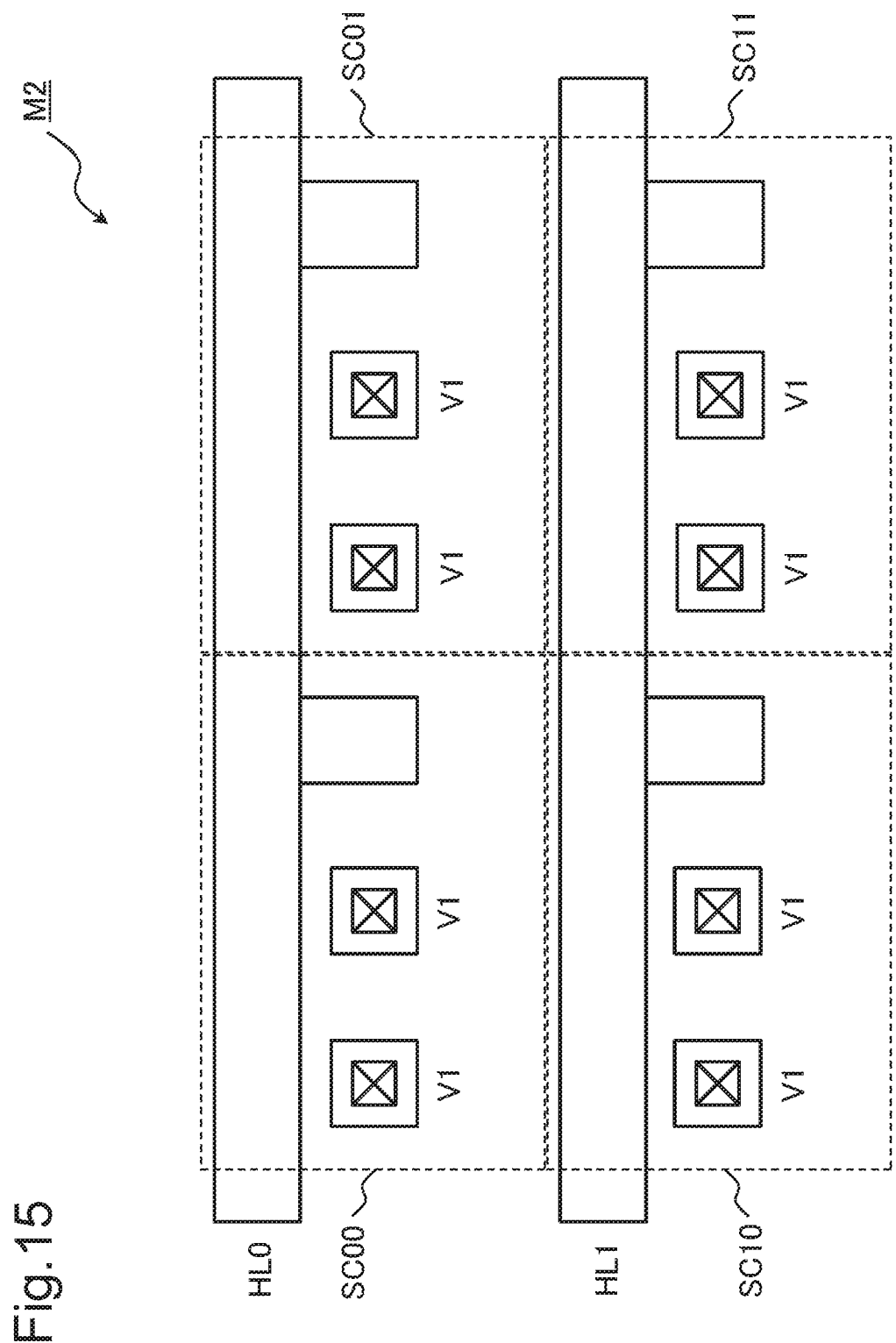
FIG. 15 is a schematic diagram illustrating one example of the switch cell array on a second wiring layer of the logic integrated circuit according to the first related art.
Figure 16:
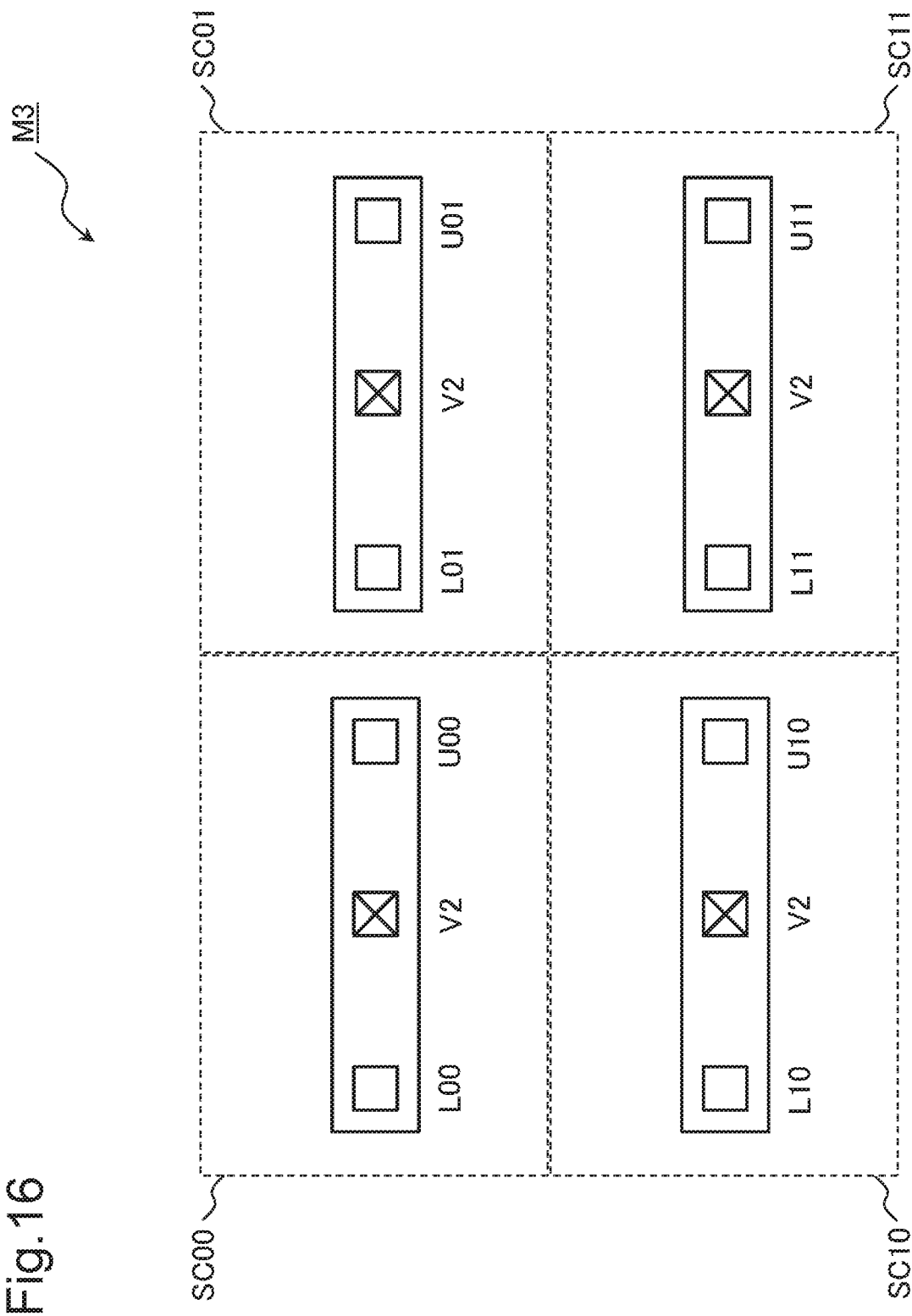
FIG. 16 is a schematic diagram illustrating one example of the switch cell array on a third wiring layer of the logic integrated circuit according to the first related art.

Next, the switch cell array 211 on a wiring layer of the logic integrated circuit according to the first related art is described with reference to the drawings. FIGS. 14 to 16 are schematic diagrams illustrating the switch cell array 211 on a wiring layer. FIGS. 14 to 16 exemplify a case where the switch cell array 211 is constituted of switch cells (SC00, SC10, SC01, and SC11) of two rows by two columns.

FIG. 14 illustrates a first wiring layer M1. As illustrated in FIG. 14, the first wirings (VL0 and VL1) and the bit lines (BL0 and BL1) are formed on the first wiring layer M1. The contacts (CT0 to 9) connect the first wiring layer M1 and the diffusion layers (DIF0 to 9).

FIG. 15 illustrates a second wiring layer M2. As illustrated in FIG. 15, the second wirings (HL0 and HL1) are formed on the second wiring layer M2. A via V1 connects the second wiring layer M2 and the first wiring layer M1.

FIG. 16 illustrates a third wiring layer M3. A via V2 connects the third wiring layer M3 and the second wiring layer M2. The first resistance-changing elements (U00, U01, U10, and U11) and the second resistance-changing elements (L00, L01, L10, and L11) are formed between the third wiring layer M3 and the second wiring layer M2.

The bit line BL0 is connected to the switch cell SC00 and the switch cell SC10. The bit line BL1 is connected to the switch cell SC01 and the switch cell SC11. The first wiring VL0 is connected to the switch cell SC00 and the switch cell SC10. The first wiring VL1 is connected to the switch cell SC01 and the switch cell SC11. The second wiring HL0 is connected to the switch cell SC00 and the switch cell SC01. The second wiring HL1 is connected to the switch cell SC10 and the switch cell SC11.

In the switch cell SC00, the bit line BL0 is connected to the diffusion layer DIF0 via the contact CT0, and is connected to the diffusion layer DIF2 via the contact CT2. The first wiring VL0 is connected one terminal of the second resistance-changing element L00. The other terminal of the second resistance-changing element L00 is connected to the diffusion layer DIF1 via the third wiring layer M3, and forms a shared node. The second wiring HL0 is connected to one terminal of the first resistance-changing element U00. The other terminal of the first resistance-changing element U00 is connected to the diffusion layer DIF1 via the third wiring layer M3, and forms a shared node.

Second Related Art

Figure 17:
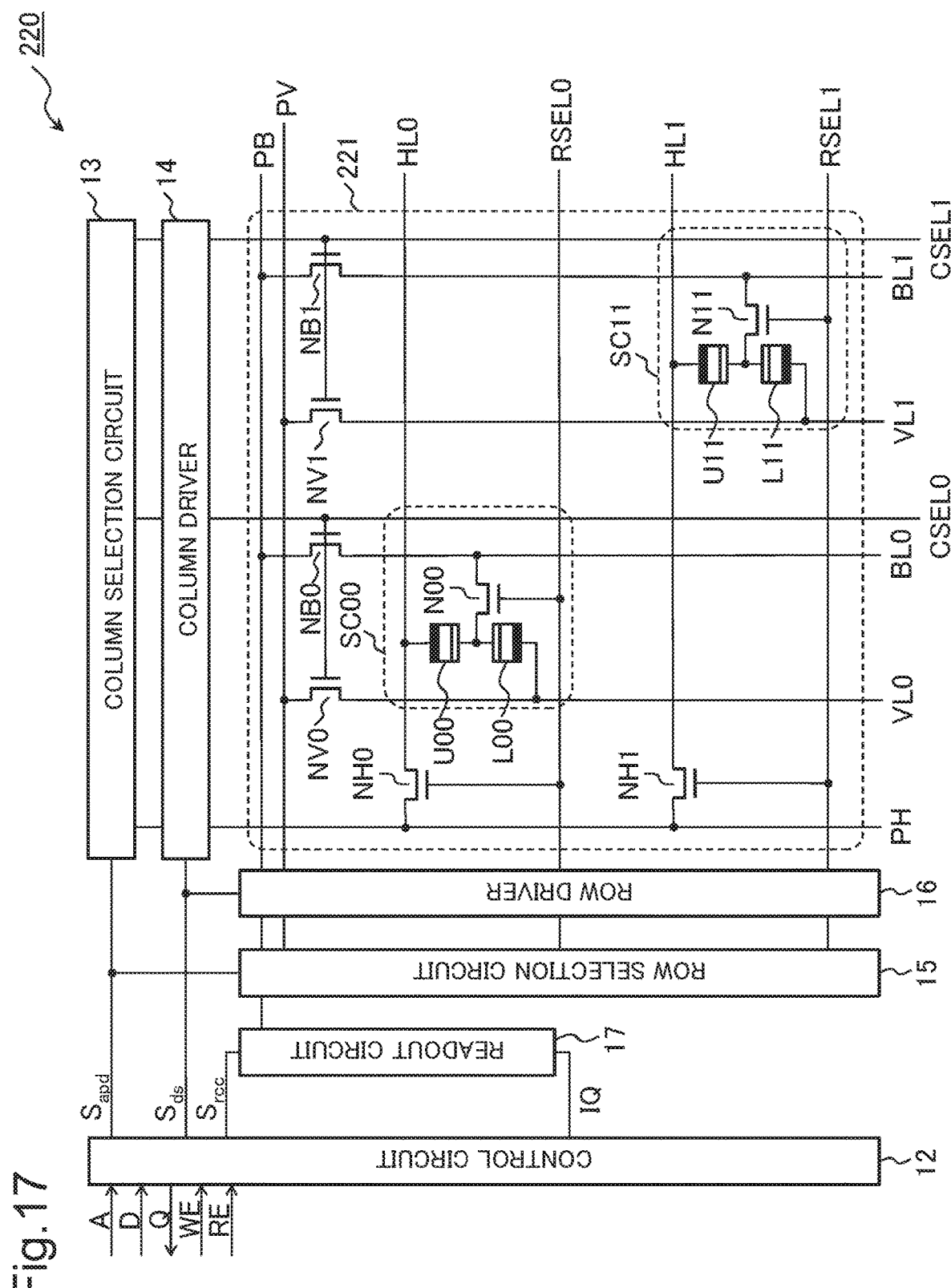
FIG. 17 is a schematic diagram illustrating a circuit configuration of a programmable logic core included in a logic integrated circuit according to a second related art.

FIG. 17 is a schematic diagram illustrating a circuit configuration of a programmable logic core 220 of a logic integrated circuit according to the second related art. A circuit configuration of the programmable logic core 220 is different from the first related art in a configuration of a switch cell array 221. Since a configuration of components other than the switch cell array 221 is similar to the first related art, detailed description thereof is omitted.

The switch cell array 221 includes switch cells for switching connection and disconnection of first wirings (VL0 and VL1) and second wirings (HL0 and HL1) at some of portions where the first wirings (VL0 and VL1) and the second wirings (HL0 and HL1) intersect with each other. In the example of FIG. 17, the switch cell array 221 includes two switch cells (SC00 and SC11) at some of the portions where the first wirings (VL0 and VL1) and the second wirings (HL0 and HL1) intersect with each other. FIG. 17 illustrates a configuration example in which the switch cell array 221 includes two switch cells. However, there is no limitation on the number of switch cells.

Figure 18:
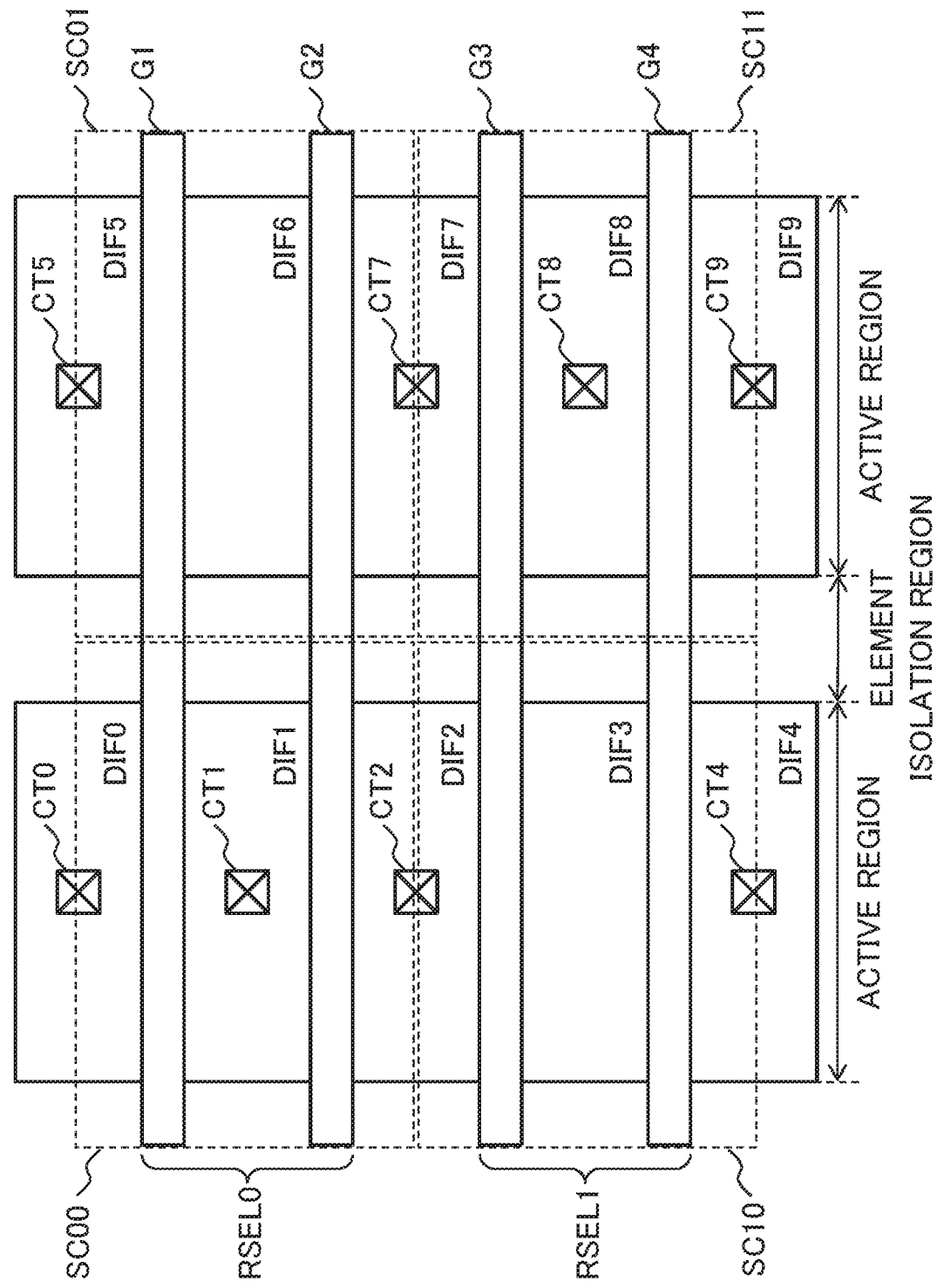
FIG. 18 is a schematic diagram illustrating one example of a switch cell array on a transistor layer of the logic integrated circuit according to the second related art.

FIG. 18 is a schematic diagram illustrating the switch cell array 221 on a transistor layer. The switch cell array 221 on a transistor layer is different from the switch cell array 211 according to the first related art in a point that a diffusion layer DIF3 and a diffusion layer DIF6 are regions that cannot be effectively used.

Figure 19:
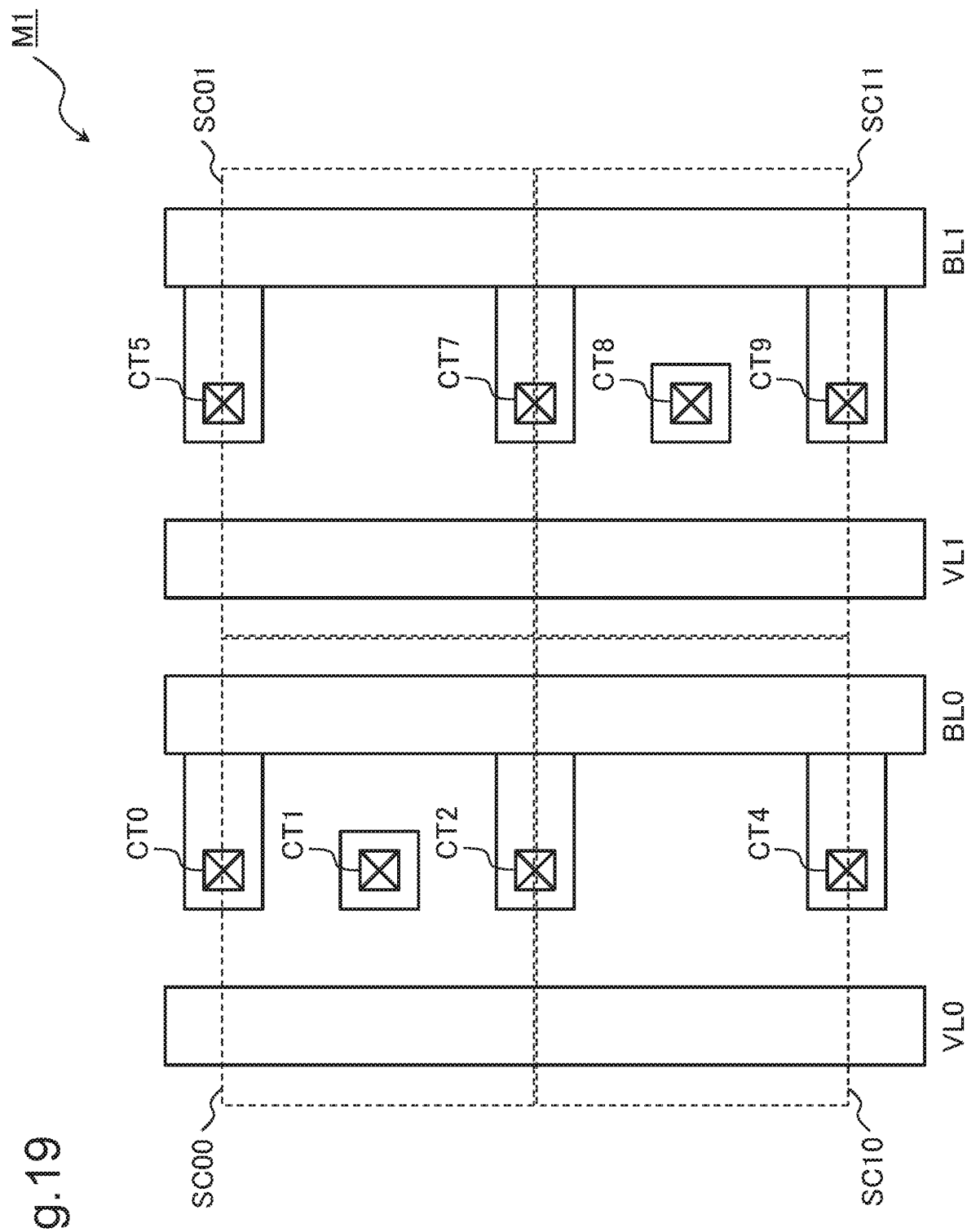
FIG. 19 is a schematic diagram illustrating one example of the switch cell array on a first wiring layer of the logic integrated circuit according to the second related art.

FIG. 19 illustrates a first wiring layer M1. As illustrated in FIG. 19, the first wirings (VL0 and VL1) and bit lines (BL0 and BL1) are formed on the first wiring layer M1. Contacts (CT0 to 2, 4, 5, and 7 to 9) connect the first wiring layer M1 and diffusion layers (DIF0 to 2, 4, 5, and 7 to 9).

Figure 20:
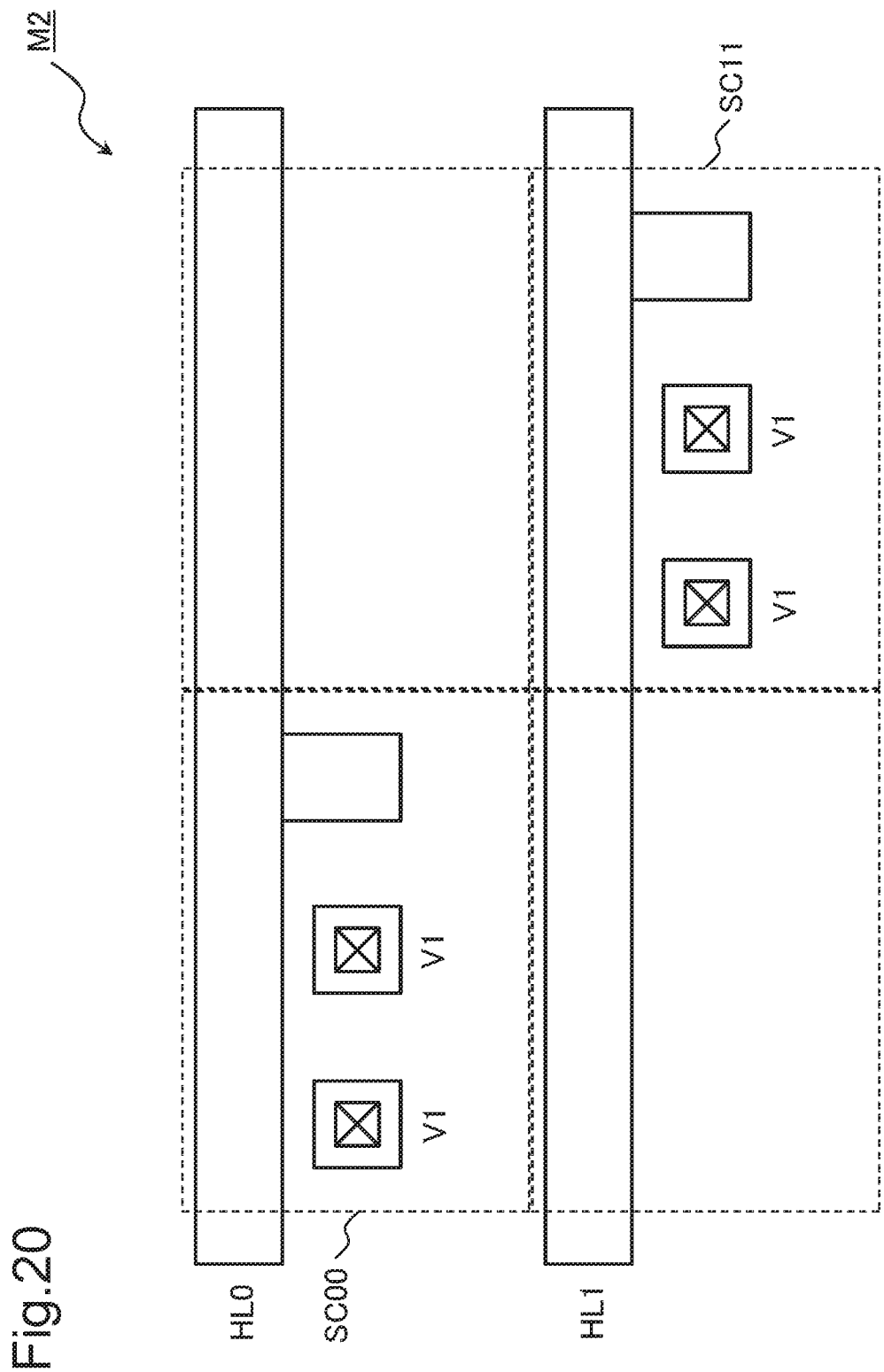
FIG. 20 is a schematic diagram illustrating one example of the switch cell array on a second wiring layer of the logic integrated circuit according to the second related art.

FIG. 20 illustrates a second wiring layer M2. As illustrated in FIG. 20, the second wirings (HL0 and HL1) are formed on the second wiring layer M2. A via V1 connects the second wiring layer M2 and the first wiring layer M1.

Figure 21:
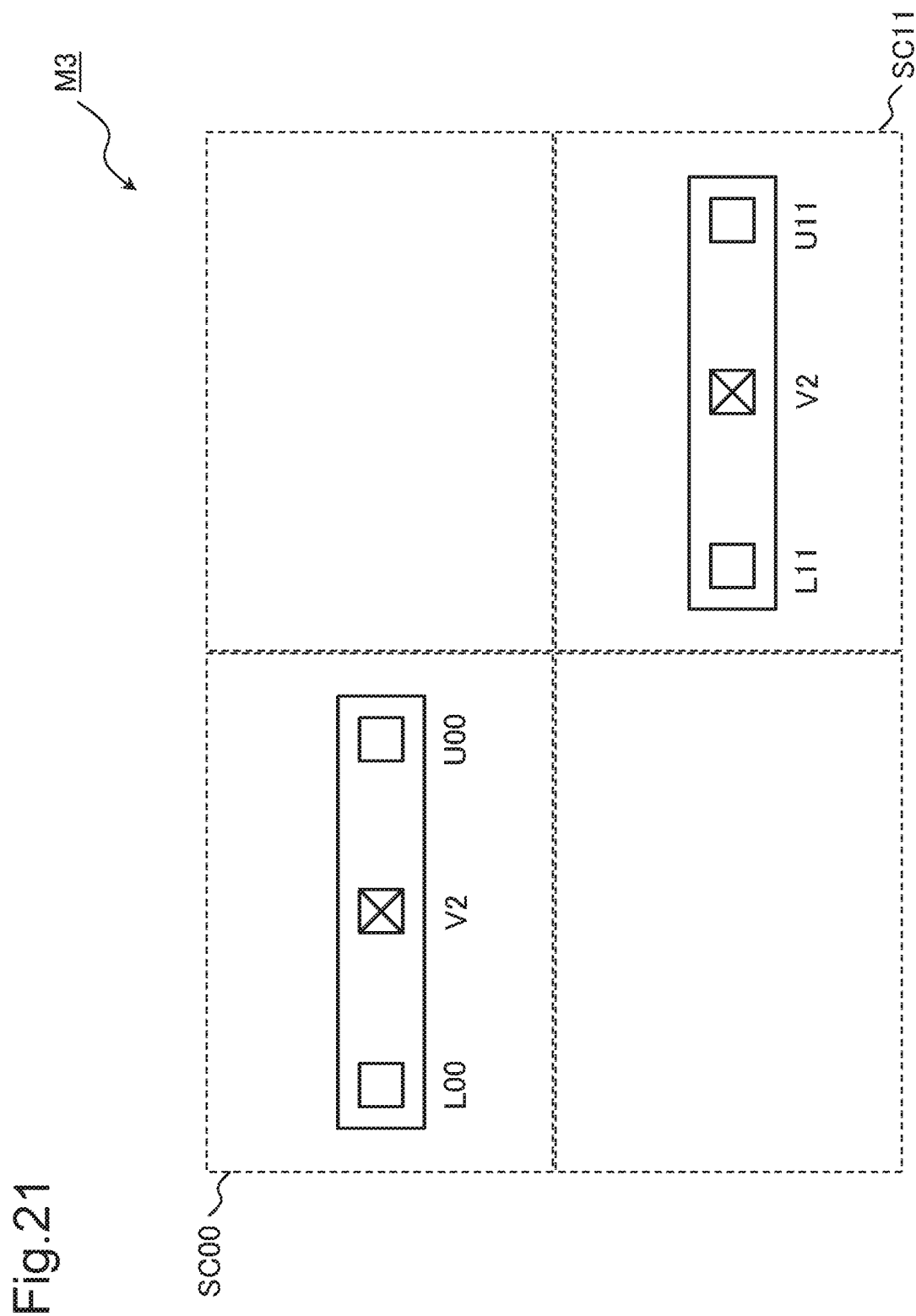
FIG. 21 is a schematic diagram illustrating one example of the switch cell array on a third wiring layer of the logic integrated circuit according to the second related art.
Figure 22:
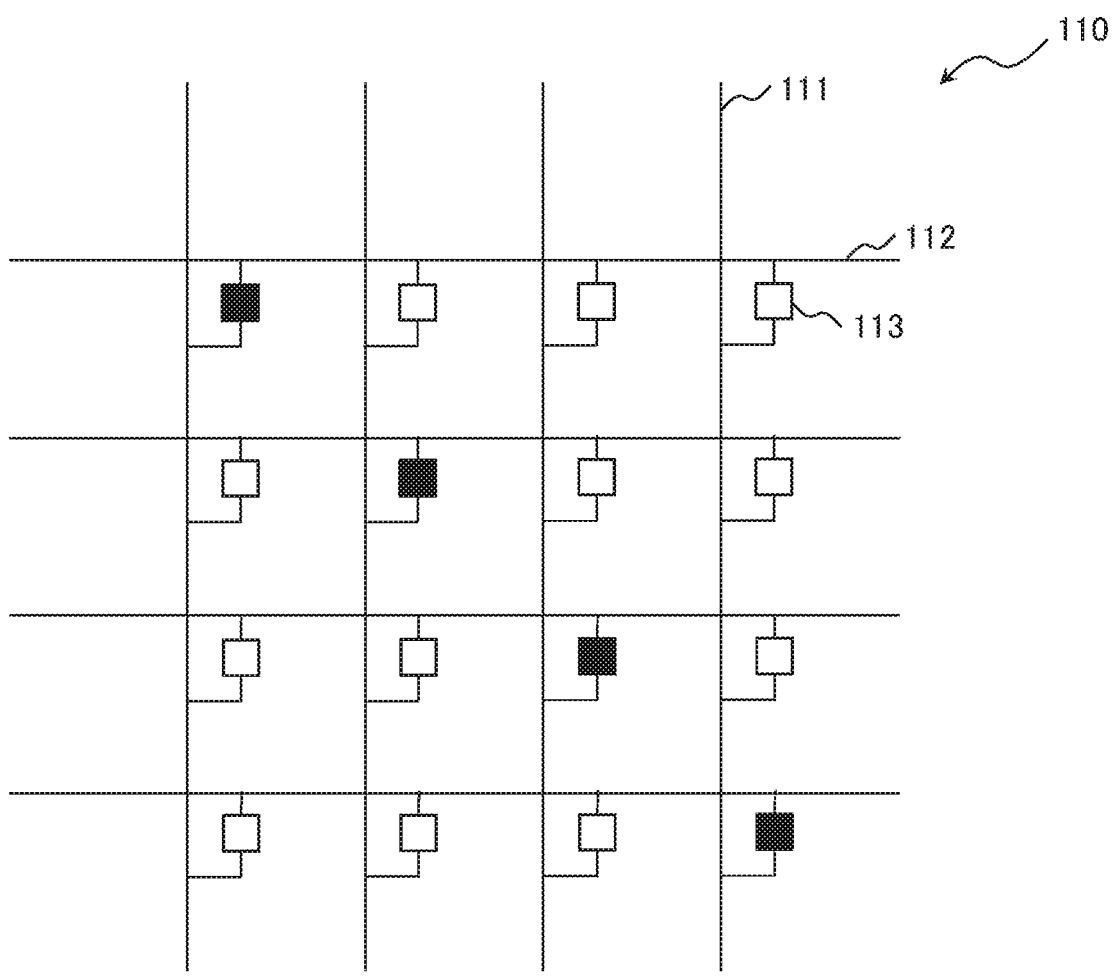
FIG. 22 is a conceptual diagram illustrating one example of a general crossbar circuit using a switch cell including a resistance-changing element.
Figure 23:
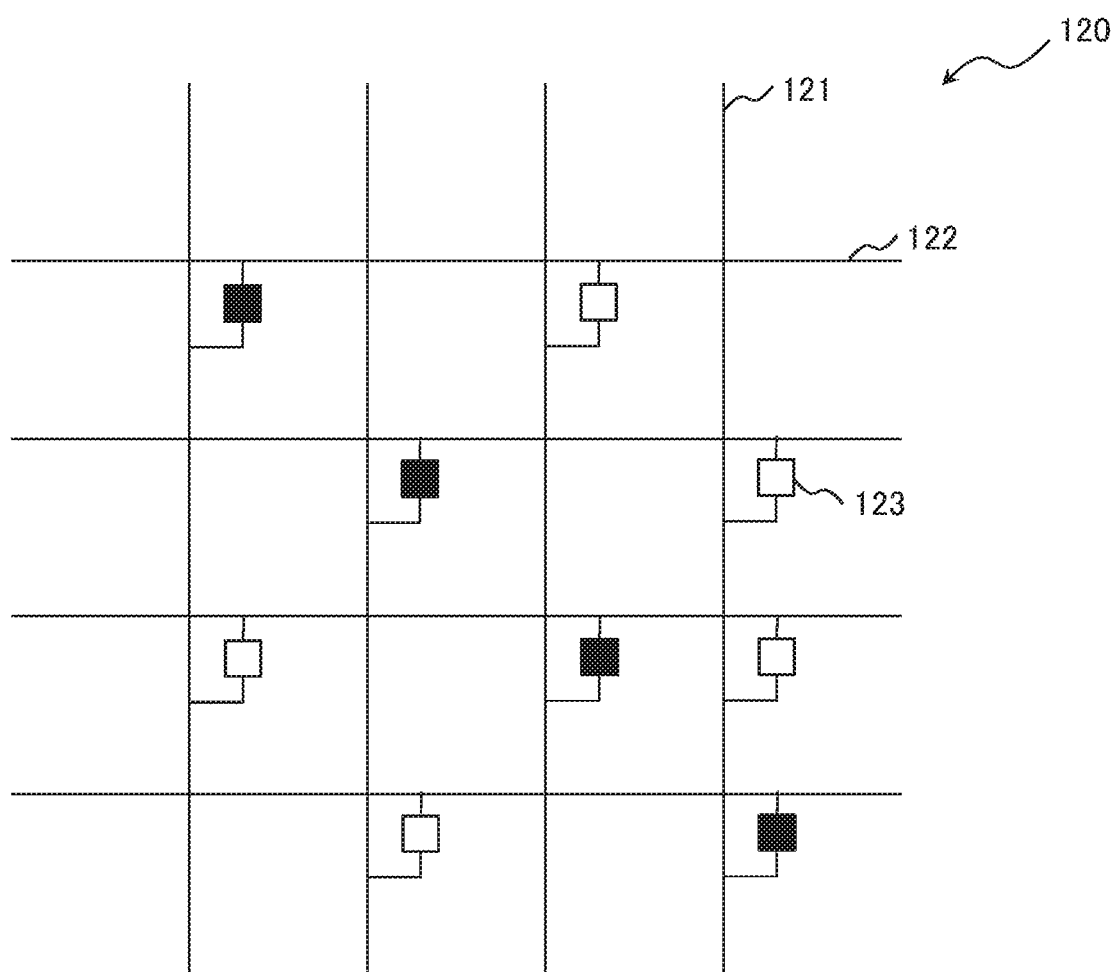
FIG. 23 is a conceptual diagram illustrating another example of the general crossbar circuit using the switch cell including the resistance-changing element.

FIG. 21 illustrates a third wiring layer M3. A via V2 connects the third wiring layer M3 and the second wiring layer M2. First resistance-changing elements (U00 and U11) and second resistance-changing elements (L00 and L11) are formed between the third wiring layer M3 and the second wiring layer M2.

The bit line BL0 is connected to the switch cell SC00. The bit line BL1 is connected to the switch cell SC11. The first wiring VL0 is connected to the switch cell SC00. The first wiring VL1 is connected to the switch cell SC11. The second wiring HL0 is connected to the switch cell SC00. The second wiring HL1 is connected to the switch cell SC11.

In the switch cell SC00, the bit line BL0 is connected to the diffusion layer DIF0 via the contact CT0, and is connected to the diffusion layer DIF2 via the contact CT2. The first wiring VL0 is connected to one terminal of the second resistance-changing element L00. The other terminal of the second resistance-changing element L00 is connected to the diffusion layer DIF1 via the third wiring layer M3, and forms a shared node. The second wiring HL0 is connected to one terminal of the first resistance-changing element U00. The other terminal of the first resistance-changing element U00 is connected to the diffusion layer DIF1 via the third wiring layer M3, and forms a shared node.

The logic integrated circuit according to the second related art has a small number of switch cells to be mounted, as compared with the logic integrated circuit according to the first related art. However, in the logic integrated circuit according to the second related art, a region that cannot be effectively used is generated due to a constraint on a layout of transistors, and a circuit area becomes substantially equal to a circuit area of the logic integrated circuit according to the first related art. In the logic integrated circuit according to the second related art, switch cells adjacent to each other cannot share a diffusion layer.

As described above, the logic integrated circuit according to each of the example embodiments of the present invention has a small number of switch cells to be mounted, as compared with the logic integrated circuits according to the related arts. The logic integrated circuit according to each of the example embodiments of the present invention is able to achieve a compact layout by causing switch cells to be connected to different first wirings to share a bit line, and causing switch cells adjacent to each other in a column direction to share a diffusion layer.

The logic integrated circuit according to each of the example embodiments of the present invention has a small number of elements to be connected to a first wiring, as compared with the logic integrated circuits according to the related arts. The logic integrated circuit according to each of the example embodiments of the present invention is able to individually control a column selection line. Therefore, the logic integrated circuit according to each of the example embodiments of the present invention is able to reduce the number of elements to which a voltage is applied at a time of writing and at a time of reading. Consequently, each of the example embodiments of the present invention is able to suppress erroneous writing to an unintended bit at a time of writing, and suppress snake current at a time of reading. This enables enhancement of reliability.

As described above, each of the example embodiments according to the present invention is able to provide a logic integrated circuit that achieves both of chip area reduction and reliability enhancement.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2018-010114, filed on Jan. 25, 2018, the disclosure of which is incorporated herein in its entirety by reference.

REFERENCE SIGNS LIST

1 Logic integrated circuit
10 Programmable logic core
11 Switch cell array
12 Control circuit
13 Column selection circuit
14 Column driver
15 Row selection circuit
16 Row driver
17 Readout circuit
20 Configuration circuit
30 Configuration port
40 General-purpose port
50 Resistance-changing element
51 First electrode
52 Second electrode
53 Resistance-changing layer
500A, 500B Three-terminal resistance-changing switch
511A, 511B First electrode
512A, 512B Second electrode
513A, 513B Resistance-changing layer

What is claimed is:
1. A logic integrated circuit comprising
  a switch cell array including
    a plurality of first wirings extending in a first direction,
    a plurality of second wirings extending in a second direction,
    a switch cell including a unit element including two serially connected resistance-changing elements, and
    a cell transistor to be connected to a shared terminal of the two resistance-changing elements, and a bit line to which the shared terminal is connected via the cell transistor, wherein the two switch cells adjacent to each other in the first direction are each connected to the different first wiring and the different second wiring, and share the bit line, and a diffusion layer to which the bit line is connected.

2. The logic integrated circuit according to claim 1, wherein one end of the unit element is connected to one of the first wirings, another end of the unit element is connected to one of the second wirings, and the shared terminal is connected to one of the bit lines via the cell transistor.

3. The logic integrated circuit according to claim 1, wherein the switch cell array includes a first selection line extending in the first direction, and a second selection line extending in the second direction, and gates of the cell transistors of the two switch cells adjacent to each other in the first direction are each connected to the different second selection line.

4. The logic integrated circuit according to claim 3, wherein the switch cell array includes a first transistor to be connected to the first wiring, a second transistor to be connected to the second wiring, a third transistor to be connected to the bit line, a first control line to be connected to the second wiring via the second transistor, a second control line to be connected to the first wiring via the first transistor, and a third control line to be connected to the bit line via the third transistor.

5. The logic integrated circuit according to claim 4, wherein, regarding the two switch cells adjacent to each other in the first direction, gates of the first transistor and the third transistor are each connected to the different first selection line, a gate of the second transistor is connected to the different second selection line, and the two switch cells are each connected to the different first selection line via the first transistor connected to the different first wiring.

6. The logic integrated circuit according to claim 4, wherein, regarding the two switch cells adjacent to each other in the first direction, gates of the first transistor and the third transistor are each connected to the common first selection line, a gate of the second transistor is connected to the different second selection line, and the two switch cells are each connected to the common first selection line via the first transistor connected to the different first wiring.

7. The logic integrated circuit according to claim 4, wherein the two switch cells adjacent to each other in the first direction are each connected to the different second selection line via the different second transistor.

8. The logic integrated circuit according to claim 4, wherein the switch cell is connected to the second selection line constituted of two gate electrodes.

9. The logic integrated circuit according to claim 1, further comprising:

a configuration port to which a signal including configuration information for forming a desired logic circuit is input;

a configuration circuit that outputs a signal to the switch cell array, based on a signal including the configuration information input from the configuration port, and performs writing and reading of data of the switch cell array; and a general-purpose port to which data to be written in the switch cell array are input, and data read out from the switch cell array are output.

10. The logic integrated circuit according to claim 4, further comprising:

a configuration port to which a signal including configuration information for forming a desired logic circuit is input;

a configuration circuit that outputs a signal to the switch cell array, based on a signal including the configuration information input from the configuration port, and performs writing and reading of data of the switch cell array;

a general-purpose port to which data to be written in the switch cell array are input, and data read out from the switch cell array are output;

a control circuit that outputs an address pre-decode signal for selecting the desired switch cell, based on address data included in a signal from the configuration circuit;

a first selection circuit that selects, based on the address pre-decode signal, the first selection line to which the desired switch cell is connected, and outputs a first decoded signal for selecting the first control line;

a first driver that supplies a voltage to the first control line according to the first decoded signal;

a second selection circuit that selects, based on the address pre-decode signal, the second selection line to which the desired switch cell is connected, and outputs a second decoded signal for selecting the second control line;

a second driver that supplies a voltage to the second control line according to the second decoded signal; and a readout circuit that senses a resistance state of the switch cell via the third control line, and outputs read output data to the control circuit.

* * * * *